United States Patent
Akiyama

(10) Patent No.: US 6,246,101 B1
(45) Date of Patent: Jun. 12, 2001

(54) ISOLATION STRUCTURE AND SEMICONDUCTOR DEVICE INCLUDING THE ISOLATION STRUCTURE

(75) Inventor: Hajime Akiyama, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/210,723

(22) Filed: Dec. 14, 1998

(30) Foreign Application Priority Data

Jul. 7, 1998 (JP) .................................................. 10-191776

(51) Int. Cl.⁷ .................................................. H01L 29/78
(52) U.S. Cl. .......................... 257/508; 257/409; 257/367; 257/488; 257/520
(58) Field of Search .................................. 257/409, 367, 257/488, 489, 400, 507, 508, 520

(56) References Cited

U.S. PATENT DOCUMENTS

| | | |
|---|---|---|
| 5,804,864 | 9/1998 | Akiyama . |
| 5,939,755 * | 8/1999 | Takeuchi .............................. 257/508 |
| 6,011,297 * | 1/2000 | Rynne ................................. 257/508 |
| 6,051,868 * | 4/2000 | Watanabe ............................. 257/508 |

FOREIGN PATENT DOCUMENTS

| | | |
|---|---|---|
| 6-310594 | 11/1994 | (JP) . |
| 7-45699 | 2/1995 | (JP) . |
| 7-131010 | 5/1995 | (JP) . |
| 9-64342 | 3/1997 | (JP) . |

OTHER PUBLICATIONS

"A 500V 1A 1–Chip Inverter IC with a New Electric Field Reduction Structure", K. Endo et al., ISPSD '94, pp. 379–383.

"An improvement on p–channel SOI LIGBT by adopting slit type p–drift structure", H. Akiyama et al., ISPSD '97, pp. 353–356.

"Numerical Predictions of p–channel SOI LIGBT Electrical Characteristics", H. Funaki et al., ISPSD '95, pp. 350–353.

* cited by examiner

Primary Examiner—Jerome Jackson, Jr.
(74) Attorney, Agent, or Firm—McDermott, Will & Emery

(57) ABSTRACT

An isolation structure capable of preventing deterioration of breakdown voltage of a semiconductor device is obtained. The isolation structure, positioned between first and second conductive regions formed on a major surface of a semiconductor substrate for electrically insulating the first and second conductive regions from each other, includes a first conductor formed on a position deeper than the major surface of the semiconductor substrate, an insulator positioned in a direction opposite to that of the position of the first conductive region as viewed from the first conductor and formed on a position deeper than the major surface of the semiconductor substrate and a second conductor positioned in a direction opposite to that of the position of the first conductor as viewed from the insulator and formed on a position deeper than the major surface of the semiconductor substrate.

35 Claims, 29 Drawing Sheets

US 6,246,101 B1

ISOLATION STRUCTURE AND SEMICONDUCTOR DEVICE INCLUDING THE ISOLATION STRUCTURE

CROSS-REFERENCE TO RELATED APPLICATION

This application is related to the co-pending U.S. patent application Ser. No. 08/977,622 submitted on Nov. 25, 1997.

BACKGROUND OF THE INVENTION

1. Field of the Invention

The present invention relates to an isolation structure and a semiconductor device including the isolation structure, and more specifically, it relates to an isolation structure capable of suppressing electric field concentration and a semiconductor device including the isolation structure.

2. Description of the Prior Art

In general, a p-channel LIGBT (lateral insulated gate bipolar transistor) formed on an SOI (silicon on insulator) substrate is known as one of semiconductor devices. This LIGBT is a MOS gate controlled power device generally applied to an electric motor or the like requiring a high voltage and a heavy current. FIG. 51 is a sectional view showing a conventional p-channel LIGBT. With reference to FIG. 51, the structure of the conventional p-channel LIGBT is now described.

Referring to FIG. 51, the conventional p-channel LIGBT includes a semiconductor substrate 101, a buried oxide film 102, an n⁻-type SOI layer 103, a p-channel MOS transistor 104, a p⁺-type emitter diffusion region 105, an n-type emitter diffusion region 106, a p⁻-type diffusion region 107, a p-type collector diffusion region 109, an n⁺-type collector diffusion region 110, a gate insulator film 108, a field oxide film 111a, first multi-field plates 112a to 112c, second multi-field plates 114a to 114d, an emitter electrode 116 and a collector electrode 117.

The buried oxide film 102 is formed on the semiconductor substrate 101. The n⁻-type SOI layer 103 is formed on the buried oxide film 102. The p⁺-type emitter diffusion region 105, the n-type emitter diffusion region 106, the p⁻-type diffusion region 107, the p-type collector diffusion region 109 and the n⁺-type collector diffusion region 110 are formed on prescribed regions of the SOI layer 103. The field oxide film 111a is formed on a major surface of the SOI layer 103 in a region positioned on the p⁻-type diffusion region 107. The gate insulator film 108 is formed on the major surface of the SOI layer 103. The gate electrode 120 is formed on the gate insulator film 108. The p⁺-type emitter diffusion region 105, the p⁻-type diffusion region 107, the gate insulator film 108 and the gate electrode 120 form the p-channel MOS transistor 104. The p-type collector diffusion region 109 is formed to be in contact with the p⁻-type diffusion region 107. The first multi-field plates 112a to 112c consisting of conductor films of doped polysilicon or the like are formed on the major surface of the SOI layer 103 and the field oxide film 111a. An interlayer insulator film 113 is formed on the first multi-field plates 112a to 112c and the gate electrode 120. The second multi-field plates 114a to 114d are formed on the interlayer insulator film 113 by aluminum wires or the like. The emitter electrode 116 is formed to be electrically connected with the p⁺-type emitter diffusion region 105 and the n-type emitter diffusion region 106. The collector electrode 117 is formed to be electrically connected with the p-type collector diffusion region 109 and the n⁺-type collector diffusion region 110. A glass-coated insulator film 115 is formed on the emitter electrode 116, the collector electrode 117 and the second multi-field plates 114a to 114d. A trench isolation structure 118 including a field oxide film 111b is formed to be adjacent to the p-type collector diffusion region 109. A back electrode 121 is formed along the overall back surface of the semiconductor substrate 101.

The LIGBT having the sectional structure shown in FIG. 51 is formed symmetrically about a centerline 119, and has a substantially circular layout as shown in FIG. 52, for example. FIG. 52 is a partially fragmented perspective view of an exemplary conventional LIGBT. While the LIGBT shown in FIG. 52 has a circular layout, the layout of such an LIGBT is not restricted to the circular one but may be a square or rectangular one symmetrical about the centerline 119.

An OFF operation of the conventional LIGBT shown in FIG. 51 is now described with reference to FIG. 53. FIG. 53 is a typical sectional view for illustrating the OFF operation of the conventional LIGBT.

Referring to FIG. 53, the emitter electrode 116 is connected to a power source having a positive potential (+V) in the OFF operation of the conventional LIGBT. The gate electrode 120 is set at the same level as a power supply potential. The collector electrode 117 and the back electrode 121 are grounded and maintain a ground potential.

In this potential state, a depletion layer extends from a p-n junction part of a boundary surface J1 between the p⁻-type diffusion region 107 and the p-type collector diffusion region 109 and the n⁻-type SOI layer 103 toward the n⁻-type SOI layer 103. A first potential 122 is formed in the extending depletion layer. This is called a RESURF (reduced surface) effect, which is a basic technique employed for improving breakdown voltage of a lateral device.

In the conventional LIGBT, sharing of voltage load between the silicon and oxide films in the vertical direction is decided in response to the ratio between the dielectric constants thereof. In the transverse direction, on the other hand, the first and second multi-field plates 112a to 112c and 114a to 114d attain electric field relaxation. In other words, the first and second multi-field plates 112a to 112c and 114a to 114d homogenize the profile of the first potential 122 in the device surface area by capacitive coupling formed by the insulator and conductor films (this function is hereinafter referred to capacitive potential division). Consequently, it is possible to suppress occurrence of an avalanche phenomenon caused by electric field concentration resulting from local heterogeneity of the first potential 122.

Thus, no voltage load is applied to the trench isolation structure 118 in the OFF operation of the conventional LIGBT. As shown in FIG. 54, the main function of the trench isolation structure 118 is to bear a second potential 125 generated when an external potential ($V_{EX}$) is supplied to an external region 123 for maintaining isolation between the device and the external region 123. FIG. 54 is a typical sectional view for illustrating the function of the trench isolation structure 118.

When the aforementioned LIGBT is applied to a high-side driver for a one-chip invertor, for example, the current drivability of the LIGBT must be improved, i.e., the amount of a feedable current must be increased. As a method for improving the current dlivability, it is effective to increase the channel width (peripheral length) of the gate electrode 120 (see FIG. 51). In order to increase the peripheral length of the gate electrode 120, the emitter electrode 116 and the collector electrode 117 of the LIGBT may be reversely arranged as shown in FIG. 55. FIG. 55 is a sectional view showing an LIGBT having reversely arranged emitter and collector electrodes 116 and 117. Referring to FIG. 55, a gate electrode 120 is formed on a position separated from a centerline 119 as compared with that shown in FIG. 51, due to the reverse arrangement of the emitter electrode 116 and the collector electrode 117. When the LIGBT is formed in a circular layout symmetrical about the centerline 119, therefore, the peripheral length of the gate electrode 120 can be increased as compared with that shown in FIG. 51. When the LIGBT is turned on, therefore, a larger amount of Hall current can be fed from the emitter electrode 116 to the collector electrode 117 through a p-channel MOS transistor 104.

When the emitter electrode 116 and the collector electrode 117 are reversely arranged as shown in FIG. 55, however, breakdown voltage is disadvantageously reduced in an OFF operation. This problem is now described with reference to FIG. 56. FIG. 56 is a typical sectional view for illustrating the OFF operation of the LIGBT shown in FIG. 55.

Referring to FIG. 56, the emitter electrode 116 is connected to a power source having a positive potential (+V) and the gate electrode 120 is maintained at the same level as a power supply potential in the OFF operation of the LIGBT, similarly to that shown in FIG. 53. The collector electrode 117 and a back electrode 121 are grounded to maintain a ground potential. In such a potential state, extension of a depletion layer in an n$^-$-type SOI layer 103 and a potential profile are basically reverse to those in the OFF operation of the conventional LIGBT shown in FIG. 53. In the LIGBT, therefore, first and second multi-field plates 112a to 112c and 114a to 114d keep conditions for maintaining breakdown voltage due to electric field relaxation and a RESURF effect.

In the OFF operation of the LIGBT shown in FIG. 55, however, a third potential 126 penetrates a trench isolation structure 118, as shown in FIG. 56. In this case, electric field concentration may locally take place on a boundary region between the trench isolation structure 118 and the n$^-$-type SOI layer 103 since no structure is provided for suppressing electric field concentration over a region positioned under the emitter electrode 116 and the trench isolation structure 118. Such electric field concentration results in an avalanche phenomenon, leading to reduction of the breakdown voltage in the OFF operation of the LIGBT.

In general, therefore, it is difficult to freely change the layout of the electrodes in the LIGBT, due to the reduction of the breakdown voltage.

SUMMARY OF THE INVENTION

An object of the present invention is to provide an isolation structure which can prevent a semiconductor device from deterioration of breakdown voltage.

Another object of the present invention is to provide a semiconductor device which can prevent deterioration of breakdown voltage also when the layout such as the arrangement of electrodes is changed.

An isolation structure according to a first aspect of the present invention for isolating a first conductive region and a second conductive region formed on a major surface of a semiconductor substrate from each other includes a potential regulator. The potential regulator is formed on a position deeper than the major surface of the semiconductor substrate, for reducing a potential in an electric field stepwise when the electric field is formed between the first conductive region and the second conductive region.

Therefore, local electric field concentration can be effectively prevented on the position deeper than the major surface of the semiconductor substrate. Consequently, it is possible to prevent the isolation structure from reduction of breakdown voltage resulting from electric field concentration.

In the isolation structure according to the first aspect of the present invention, the potential regulator may include a first conductor, an insulator and a second conductor. The first conductor may be formed on a position deeper than the major surface of the semiconductor substrate. The insulator may be formed on a region positioned in a direction opposite to that of the position of the first conductive region as viewed from the first conductor, and the second conductor may be formed on a region positioned in a direction opposite to that of the position of the first conductor as viewed from the insulator.

In this case, the first and second conductors and the insulator can form a capacitance. If an electric field is formed between the first conductive region and the second conductive region, an equipotential surface can be formed along a surface of the insulator due to the capacitance formed by the first and second conductors and the insulator. Consequently, the position of the equipotential surface can be controlled for preventing local electric field concentration in the isolation structure.

In the isolation structure according to the first aspect of the present invention, the first and second conductors and the insulator may be formed in a trench formed on the semiconductor substrate.

In the isolation structure according to the first aspect of the present invention, first and second trenches having side walls may be formed on the semiconductor substrate in a region between the first conductive region and the second conductive region, and the insulator may be formed on the side walls of the first and second trenches. The first conductor may be formed on the insulator in the first trench, and the second conductor may be formed on the insulator in the second trench.

An isolation structure according to a second aspect of the present invention, positioned between a first conductive region and a second conductive region formed on a major surface of a semiconductor substrate for electrically isolating the first conductive region and the second conductive region from each other, includes a first conductor, an insulator and a second conductor. The first conductor is formed on a position deeper than the major surface of the semiconductor substrate. The insulator is positioned in a direction opposite to that of the position of the first conductive region as viewed from the first conductor and formed on a position deeper than the major surface of the semiconductor substrate. The second conductor is positioned in a direction opposite to that of the position of the first conductor as viewed from the insulator and formed on a position deeper than the major surface of the semiconductor substrate.

Therefore, a capacitance consisting of the first conductor, the insulator and the second conductor can be formed on a position deeper than the major surface of the semiconductor substrate between the first and second conductive regions. Also when a voltage is applied to the first and second conductive regions and an electric field is formed between the first and second conductive regions, therefore, an equipotential surface can be formed along a surface of the insulator film due to the capacitance formed by the first and second conductors and the insulator. Therefore, the position of the equipotential surface can be controlled by adjusting the positions of the first and second conductors and the insulator in a region deeper than the major surface of the semiconductor substrate. Consequently, local electric field concentration can be prevented.

In the isolation structure according to the second aspect of the present invention, the first and second conductors and the insulator may be formed in a trench formed on the semiconductor substrate.

In the isolation structure according to the second aspect of the present invention, first and second trenches having side walls may be formed on the semiconductor substrate in a region between the first conductive region and the second conductive region, and the insulator may be formed on the side walls of the first and second trenches. The first conductor may be formed on the insulator in the first trench, and the second conductor may be formed on the insulator in the second trench.

According to the second aspect of the present invention, the isolation structure may further include an isolation insulator film, first and second field plate conductor films and a separation insulator film. The isolation insulator film may be formed on the major surface of the semiconductor substrate in a region positioned on the first and second conductors and the insulator, and the first field plate conductor film may be formed on the isolation insulator film. The second field plate conductor film may be formed on the isolation insulator film on a position close to the second conductor region from the first field plate conductor film at a space, and the separation insulator film may be formed between the first and second field plate conductor films.

Thus, the first and second field plate conductor films and the separation insulator film can form a capacitance on a region positioned on the major surface of the semiconductor substrate. Also when a voltage is applied to the first and second conductive regions and an electric field is formed between the first and second conductive regions, therefore, an equipotential surface can be formed along a surface of the separation insulator film due to the capacitance formed by the first and second field plate conductor films and the separation insulator film. Thus, the position of the equipotential surface can be controlled by adjusting the positions of the first and second field plate conductor films and the separation insulator film on the isolation insulator film. In addition, the position of the equipotential surface can be further reliably controlled by the capacitance formed by the first and second conductors and the insulator on the region deeper than the major surface of the semiconductor substrate and that formed by the first and second field plate conductor films and the separation insulator film on the isolation insulator film. Consequently, local electric field concentration can be more reliably prevented.

In the isolation structure according to the second aspect of the present invention, the first field plate conductor film may be electrically connected with the first conductive region through a resistive element, the second field plate conductor film may be electrically connected with the second conductive region through a resistive element, and the first and second field plate conductive films may be electrically connected with each other through a resistive element.

Therefore, the potentials of the first and second field plate conductor films can be decided by regulating the voltage applied to the first and second conductive regions and the resistance values of the resistive elements. Thus, the potential of the equipotential surface formed along the surface of the separation insulator film can be reliably decided (this function is hereinafter referred to as resistive potential division). Consequently, the position of the equipotential surface can be reliably controlled also when conductive foreign matter adheres to a portion around the isolation insulator film on the semiconductor substrate in a step of forming the first and second field plate conductor films or the like, the separation insulator film is locally heterogeneously formed or electrical noise is externally applied to the isolation structure, thereby reliably preventing electric field concentration.

The potentials of the first and second field plate conductor films can be regulated by adjusting the resistance values of the resistive elements or the like, thereby increasing the degree of freedom for the layout of the first and second field plate conductor films, the separation insulator film and the like.

According to the second aspect of the present invention, the isolation structure may further include an interlayer insulator film, third and fourth field plate conductor films and an upper insulator film. The interlayer insulator film may be formed on the first and second field plate conductor films, and the third field plate conductor film may be formed on the interlayer insulator film. The fourth field plate conductor film may be electrically insulated from the third field conductor film and formed at a space, and the upper insulator film may be formed between the third and fourth field plate conductor films.

Therefore, the third and fourth field plate conductor films and the upper insulator film can form a capacitance on the interlayer insulator film. The position of an equipotential surface formed along a surface of the upper insulator film can be controlled by adjusting the positions of the third and fourth field plate conductor films and the upper insulator film. Consequently, local electric field concentration can be more reliably prevented.

Further, the isolation structure including the first and second field plate conductor films having the resistive potential dividing function and the third and fourth field plate conductor films having the capacitive potential dividing function can implement more proper potential division by adjusting load balance between the resistive potential dividing function and the capacitive potential dividing function in consideration of restriction in layout of the first to fourth field plate conductor films and design conditions such as an allowed value for a leakage current.

According to the second aspect of the present invention, the isolation structure may further include a lower insulator film formed under the semiconductor substrate, and the first conductive region may be formed to be in contact with the lower insulator film.

When a voltage higher than that for the second conductive region is applied to the first conductive region, therefore, an electric field can be formed in the lower insulator film positioned under the first conductive region since no semiconductor substrate region forming an electric field is present under the first conductive region. The insulator film has a higher breakdown voltage value than that of the semiconductor substrate, and hence it is possible to prevent deterioration of breakdown voltage and an insulated state can be maintained against higher electric field strength.

Further, no electric field concentration takes place on a boundary region between the isolation structure and the semiconductor substrate positioned under the first conductive region dissimilarly to the prior art, whereby the isolation structure can reliably maintain breakdown voltage.

In the isolation structure according to the second aspect of the present invention, the trench may have an upper surface and a lower surface, and the upper surface may have a plane area smaller than that of the lower surface. Further, first and second conductors may be formed on the lower surface.

Therefore, the first and second conductors can be formed in the vicinity of a boundary region, which has readily caused electric field concentration in the prior art, between a lower portion of the isolation structure and the semiconductor substrate. Thus, electric field concentration can be more reliably prevented on the boundary region between the lower portion of the isolation structure and the semiconductor substrate due to the resistive or capacitive potential dividing function of the first and second conductors and the insulator.

According to the second aspect of the present invention, the isolation structure may further include an isolation insulator film formed on the major surface of the semiconductor substrate in a region positioned on the trench. Further, an end portion of the upper surface of the trench may be positioned inward beyond that of the isolation insulator film, and an end portion of the lower surface of the trench may be positioned outward beyond that of the isolation insulator film.

In the isolation structure according to the second aspect of the present invention, the trench may have an upper surface and a lower surface, the upper surface may have a plane area larger than that of the lower surface, and first and second conductors may be formed on the lower surface.

According to the second aspect of the present invention, the isolation structure may further include third and fourth conductors and a side wall insulator film. The third and fourth conductors may be formed on side surfaces of the trench, and the side wall insulator film may be formed between the third and fourth conductors.

Therefore, the third and fourth conductors and the side wall insulator film can form a capacitance. Also when the first and second conductive regions are formed on relatively shallow regions of the major surface of the semiconductor substrate and the equipotential surface of the electric field formed by voltage application to the first and second conductive regions extends into the semiconductor substrate, the position of the equipotential surface extending into the semiconductor substrate can be adjusted by the capacitance formed by the third and fourth conductors and the side wall insulator film. Consequently, electric field concentration in the semiconductor substrate can be prevented.

In the isolation structure according to the second aspect of the present invention, the first conductor may be electrically connected with the first conductive region through a resistive element, and the second conductor may be electrically connected with the second conductive region through a resistive element. Further, the first conductor and the second conductor may be electrically connected with each other through a resistive element.

Therefore, the potentials of the first and second conductors can be decided from the voltage applied to the first and second conductive regions and the resistance values of the resistive elements, and the first and second conductors can be provided with a resistive potential dividing function. Thus, local electric field concentration can be more reliably prevented.

Also when the positions for forming the first and second conductors are changed, the potentials of the first and second conductors can be arbitrarily decided by regulating the voltage applied to the first and second conductive regions and the resistance values of the resistive elements, thereby increasing the degree of freedom for the design of the first and second conductors.

An isolation structure according to a third aspect of the present invention, positioned between a first conductive region and a second conductive region formed on a major surface of a semiconductor substrate for isolating the first conductive region and the second conductive region from each other, includes a resistive field plate structure and a capacitive field plate structure. The resistive field plate structure and the capacitive field plate structure are stacked with each other through an interlayer insulator film.

The resistive field plate structure includes first and second field plate conductor films. The first field plate conductor film is formed between the first conductive region and the second conductive region and electrically connected with the first conductive region through a resistive element. The second field plate conductor film is electrically connected with the first field plate conductor film and the second conductor region through resistive elements respectively and formed at a space in a direction along the position of the second conductive region as viewed from the first field plate conductor film.

The capacitive field plate structure includes third and fourth field plate conductor films and an insulator film. The third field plate conductor film is formed between the first conductive region and the second conductive region. The fourth field plate conductor film is electrically insulated from the third field plate conductor film and formed at a space. The insulator film is formed between the third field plate conductor film and the fourth field plate conductor film.

Thus, the isolation structure includes the resistive field plate structure and the capacitive field plate structure having different characteristics. Even if characteristics required to the isolation structure change in various ways, therefore, an isolation structure responsive to the required characteristics can be readily obtained.

In the resistive field plate structure, the potentials of the first and second field plate conductor films are decided from a voltage applied to the first and second conductive regions and the resistance values of the resistive elements and not influenced even if the layout of the first and second field plate conductor films is changed. Thus, the degree of freedom for the layout of the first and second field plate conductor films can be increased. In the capacitive field plate structure, on the other hand, the third and fourth field plate conductor films are electrically insulated from each other not to electrically connect the first and second conductive regions with each other, whereby a leakage current between the first and second conductive regions can be substantially zeroed. Thus, the isolation structure can readily implement various characteristics due to the provision of the two types of field plate structures having different characteristics.

A semiconductor device according to a fourth aspect of the present invention includes an isolation structure, positioned between a first conductive region and a second conductive region formed on a major surface of a semiconductor substrate for electrically isolating the first conductive region and the second conductive region from each other, includes the isolation structure having first and second conductors and an insulator. The first conductor is formed on a position deeper than the major surface of the semiconductor substrate. The insulator is positioned in a direction opposite to that of the position of the first conductive region as viewed from the first conductor and is formed on a position deeper than the major surface of the semiconductor substrate. The second conductor is positioned in a direction opposite to that of the position of the first conductor as viewed from the insulator and formed on a position deeper than the major surface of the semiconductor substrate.

Also when an electric field is formed between the first and second conductive regions, therefore, an equipotential surface can be formed along a surface of the insulator due to a capacitance formed by the first and second conductors and the insulator. The position of the equipotential surface can be controlled by adjusting the positions of the first and second conductors and the insulator, whereby local electric field concentration can be prevented.

According to the fourth aspect of the present invention, the semiconductor device may further include a first element including the first conductive region and a second element including the second conductive region, the first element may be a circumferentially formed insulated gate bipolar transistor including an emitter electrode and a collector electrode, and the isolation structure may be formed to enclose the insulated gate bipolar transistor. The emitter electrode may be formed on a region closer to the outer periphery of the circumferentially formed insulated gate bipolar transistor than the collector electrode.

The insulated gate bipolar transistor is a power device applied to an electric motor or the like requiring high voltage and a heavy current, and high breakdown voltage is required to the isolation structure applied to such an insulated gate bipolar transistor. When the isolation structure according to the present invention is applied to such an insulated gate bipolar transistor, therefore, a particularly remarkable effect can be attained.

The isolation structure has a potential dividing function formed by the first and second conductors and the insulator, whereby electric field concentration can be prevented although the emitter electrode of the insulated gate bipolar transistor is formed on the region closer to the outer periphery of the insulated gate bipolar transistor than the collector electrode. Thus, the degree of freedom for arrangement of the emitter electrode and the collector electrode of the insulated gate bipolar transistor can be increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(Embodiment 1)

Figure 1:
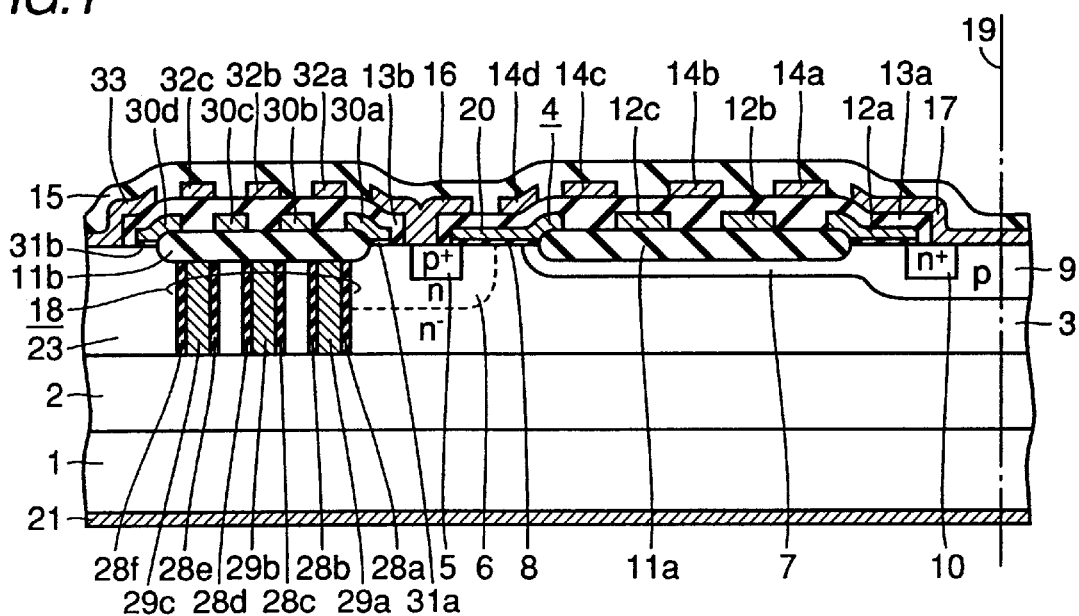
FIG. 1 is a sectional view showing a semiconductor device according to an embodiment 1 of the present invention.

Referring to FIG. 1, the semiconductor device is a p-channel LIGBT including a trench isolation structure 18, a $p^+$-type emitter diffusion region 5, an n-type emitter diffusion region 6, a $p^-$-type diffusion region 7, a p-type collector diffusion region 9, an $n^+$-type collector diffusion region 10, a gate insulator film 8, a gate electrode 20, an emitter electrode 16, a collector electrode 17, first multi-field plates 12*a* to 12*c* and second multi-field plates 14*a* to 14*d*.

A buried oxide film 2 is formed on a semiconductor substrate 1. An n⁻-type SOI layer 3 is formed on the buried oxide film 2. The p⁺-type emitter diffusion region 5, the n-type emitter diffusion region 6, the p⁻-type diffusion region 7, the p-type collector diffusion region 9 and the n⁺-type collector diffusion region 10 are formed on a major surface of the SOI layer 3. A field oxide film 11a is formed on the major surface of the SOI layer 3. The gate electrode 20 is formed on the major surface of the SOI layer 3 through the gate insulator film 8. The gate electrode 20, the gate insulator film 8, the p⁺-type emitter diffusion region 5 and the p⁻-type diffusion region 7 form a p-channel MOS transistor 4. The first multi-field plates 12a to 12c are formed on the major surface of the SOI layer 3 and the field oxide film 11a. An interlayer insulator film 13a is formed on the first multi-field plates 12a to 12c. The emitter electrode 16 is formed to be in contact with the p⁺-type emitter diffusion region 5 and the n-type emitter diffusion region 6 while extending on the interlayer insulator film 13a. The collector electrode 17 is formed to be in contact with the p-type collector diffusion region 9 and the n⁺-type collector diffusion region 10 while extending on the interlayer insulator film 13a. The second multi-field plates 14a to 14d are formed on the interlayer insulator film 13a. A glass-coated insulator film 15 is formed on the second multi-field plates 14a to 14d. The trench isolation structure 18 isolates the device region formed with the p-channel LIGBT from an external region 23.

Figure 2:
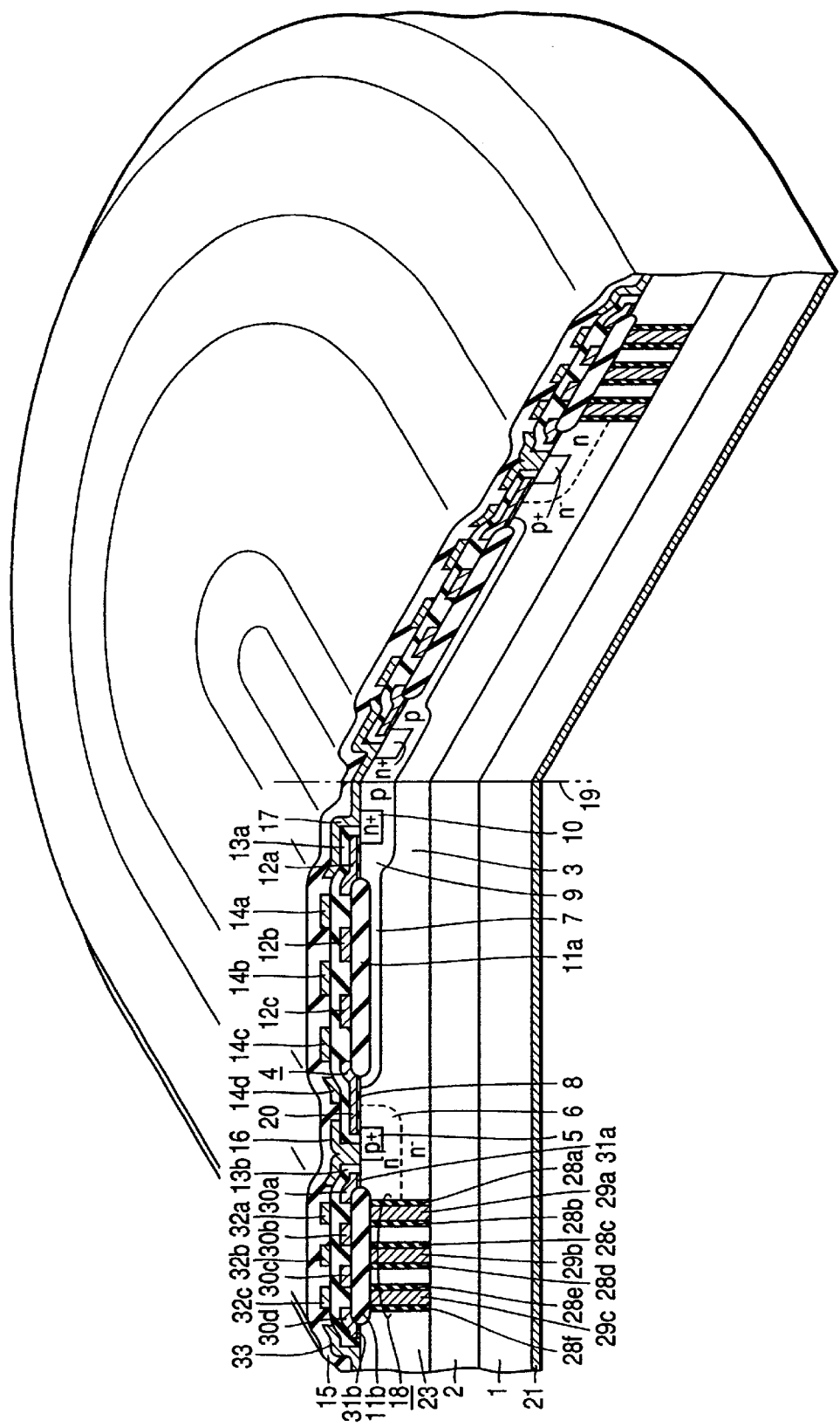
FIG. 2 is a partially fragmented perspective view showing the overall semiconductor device shown in FIG. 1.

The p-channel LIGBT having such a structure is substantially circumferentially formed about a centerline 19, as shown in FIG. 2. The trench isolation structure 18 is formed to enclose the p-channel LIGBT. A back electrode 21 is formed on a back surface of the semiconductor substrate 1.

The trench isolation structure 18 is now described with reference to FIG. 3.

Figure 3:
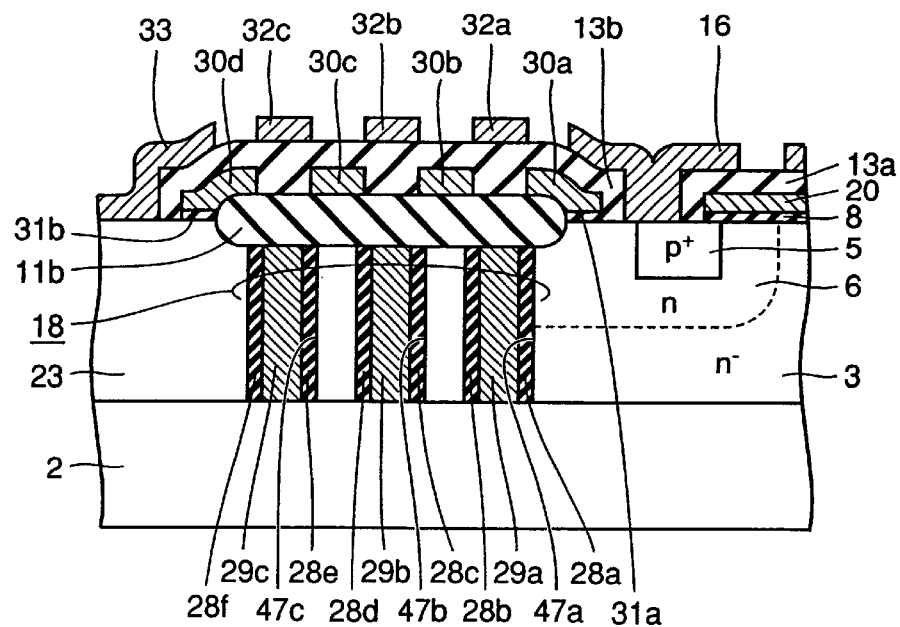
FIG. 3 is a partially enlarged sectional view of the semiconductor device shown in FIG. 1.

Referring to FIG. 3, the trench isolation structure 18 includes trench side wall insulator films 28a to 28f formed in trenches 47a to 47c, polysilicon buried films 29a to 29c, a field oxide film 11b, third multi-field plates 30a to 30d and fourth multi-field plates 32a to 32c.

The trenches 47a to 47c are formed in the SOI layer 3. The trench side wall insulator films 28a to 28f are formed on side walls of the trenches 47a to 47c. The polysilicon buried films 29a to 29c are formed on the trench side wall insulator films 28a to 28f, to fill up the trenches 47a to 47c. The polysilicon buried films 29a to 29c are made of doped polysilicon or non-doped polysilicon.

The field oxide film 11b is formed on the major surface of the SOI layer 3 in a region positioned on the trenches 47a to 47c. The third multi-field plates 30a to 30d are formed on the major surface of the SOI layer 3 and the field oxide film 11b. Insulator thin films 31a and 31b are formed between the multi-field plates 30a and 30d and the SOI layer 3 respectively. The third multi-field plates 30a to 30d are made of a conductor such as doped polysilicon, similarly to the first multi-field plates 12a to 12c (see FIG. 1). The dimensional patterns of the third multi-field plates 30a to 30d correspond to the opening patterns of the trenches 47a to 47c. The third multi-field plates 30a to 30d are formed on regions positioned between the trenches 47a to 47c respectively.

An interlayer insulator film 13b is formed on the third multi-field plates 30a to 30d. The fourth multi-field plates 32a to 32c and a terminal component 33 therefor are formed on the interlayer insulator film 13b. The dimensional patterns of the fourth multi-field plates 32a to 32c correspond to the patterns of the third multi-field plates 30a to 30d. The fourth multi-field plates 32a to 32c are formed on regions positioned between the third multi-field plates 30a to 30d respectively.

The terminal component 33 for the fourth multi-field plates 32a to 32c is electrically connected with the external region 23. The fourth multi-field plates 32a to 32c and the terminal component 33 therefor are made of aluminum or the like, similarly to the emitter electrode 16. A glass-coated insulator film (not shown) is formed on the fourth multi-field plates 32a to 32c.

An OFF operation of the semiconductor device is now described with reference to FIG. 4.

Figure 4:
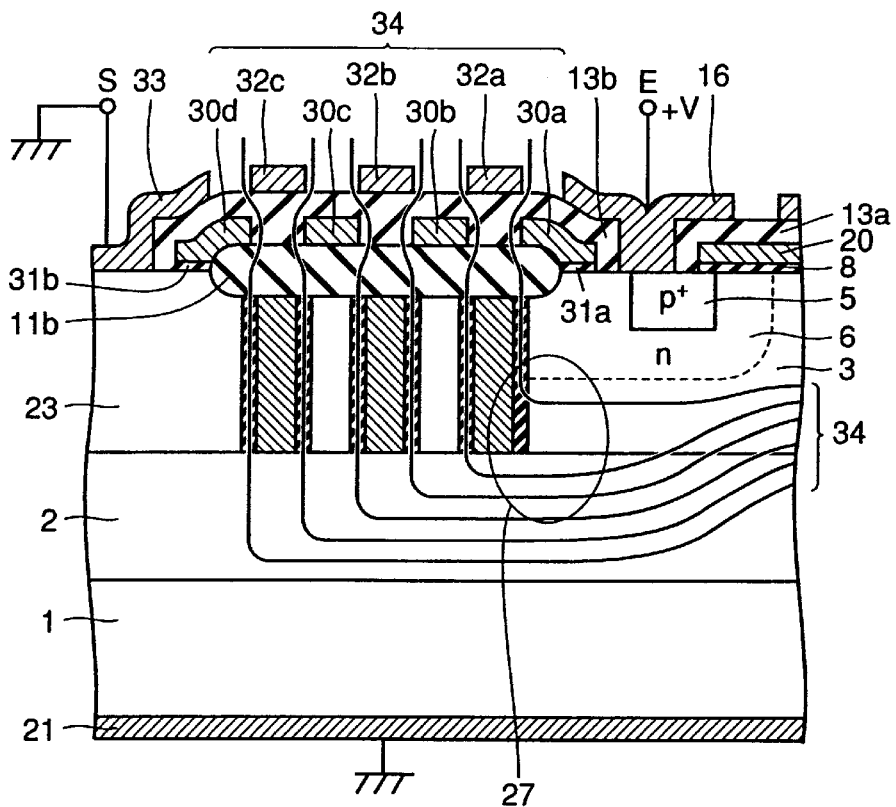
FIG. 4 is a typical sectional view for illustrating an OFF operation of the semiconductor device shown in FIG. 1.

Referring to FIG. 4, the emitter electrode 16 is connected to a power source having a positive potential (+V) in the OFF operation of the semiconductor device. The gate electrode 20 is maintained at the same level as a power supply potential. The back electrode 21 and the collector electrode 17 (see FIG. 1) are grounded and maintain a ground potential. The external region 23 and the terminal component 33 for the fourth multi-field plates 32a to 32c are supplied with the ground potential. A potential 34 generated in such a potential state is first relaxed to have a substantially homogeneous profile due to a capacitive potential dividing action of the fourth multi-field plates 32a to 32c. Further, the potential 34 is also relaxed by a capacitive potential dividing action of the third multi-field plates 30a to 30d to have uniform profile. The dimensional patterns of the third multi-field plates 30a to 30d correspond to those of the trenches 47a to 47c forming the trench isolation structure 18. Therefore, the potential 34 divided by the third multi-field plates 30a to 30d is substantially homogeneously distributed to the trench side wall insulator films 28a to 28f formed in the trenches 47a to 47c. The potential 34 is connected with a potential formed by a RESURF effect in the device body in the buried oxide film 2. This is because the potential 34 extends from the region provided with the third multi-field plates 30a to 30d and fourth multi-field plates 32a to 32c in the substantially homogeneous profile state into the buried oxide film 2 along the trench side wall insulator films 28a to 28f.

Consequently, local electric field concentration, which has been disadvantageously caused in the prior art, can be prevented in a region 27 close to the interface between the trench isolation structure 18 and the SOI layer 3. Thus, the semiconductor device can be effectively prevented from reduction of breakdown voltage resulting from electric field concentration.

Thus, local electric field concentration can be prevented in the region 27 close to the interface, whereby prescribed breakdown voltage can be obtained in the OFF operation although the emitter electrode 16 and the collector electrode 17 of the p-channel LIGBT are arranged reversely to those of the prior art as shown in FIG. 1. Consequently, the degree of freedom can be improved as compared with the prior art in relation to the layout of the emitter electrode 16 and the collector electrode 17 of the p-channel LIGBT.

Steps for fabricating the semiconductor device are now described with reference to FIGS. 5 to 9.

Figure 5:
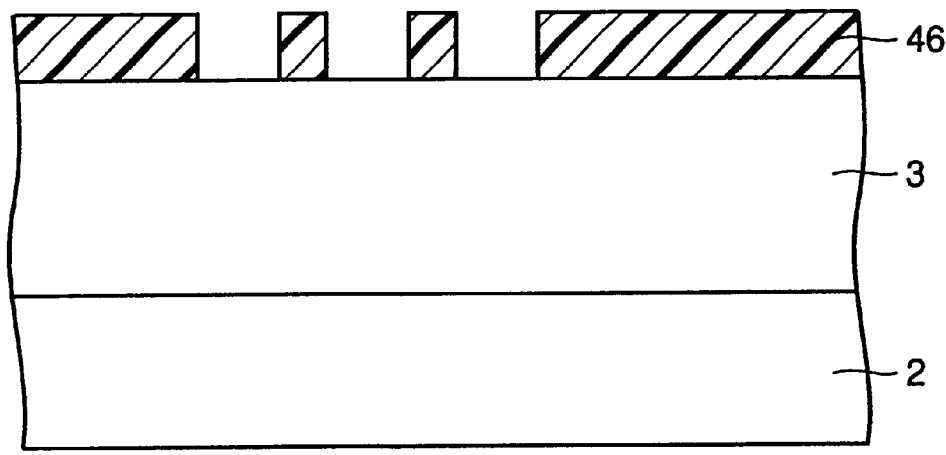
FIGS. 5 to 9 are sectional views for illustrating first to fifth steps for fabricating the semiconductor device shown in FIG. 3.

Referring to FIG. 5, the buried oxide film 2 is formed on the semiconductor substrate (not shown). The n⁻-type SOI layer 3 is formed on the buried oxide film 2. A resist pattern 46 is formed on the SOI layer 3.

Figure 6:
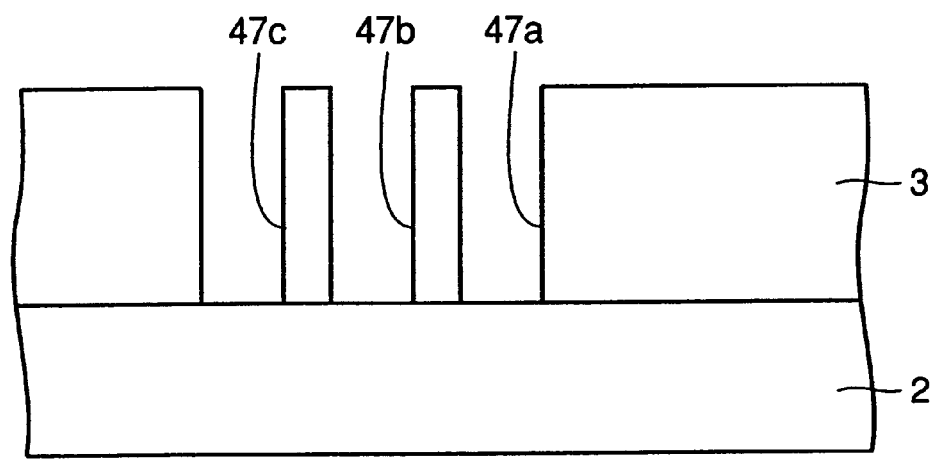

Then, the resist pattern 46 is employed as a mask for partially removing the SOI layer 3 by etching, thereby forming the trenches 47a to 47c (see FIG. 6). Thereafter the resist pattern 46 is removed. Thus, the structure shown in FIG. 6 is obtained.

Figure 7:
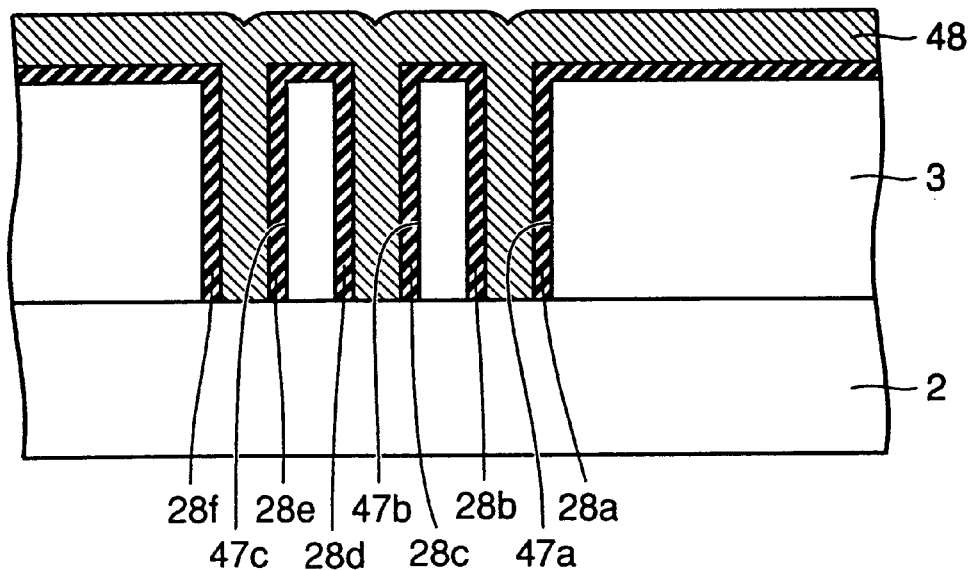

Then, insulator films 28a to 28f for defining the trench side wall insulator films are formed on the SOI layer 3 and in the trenches 47a to 47c, as shown in FIG. 7. A polysilicon film 48 is formed on the insulator films 28a to 28f.

Figure 8:
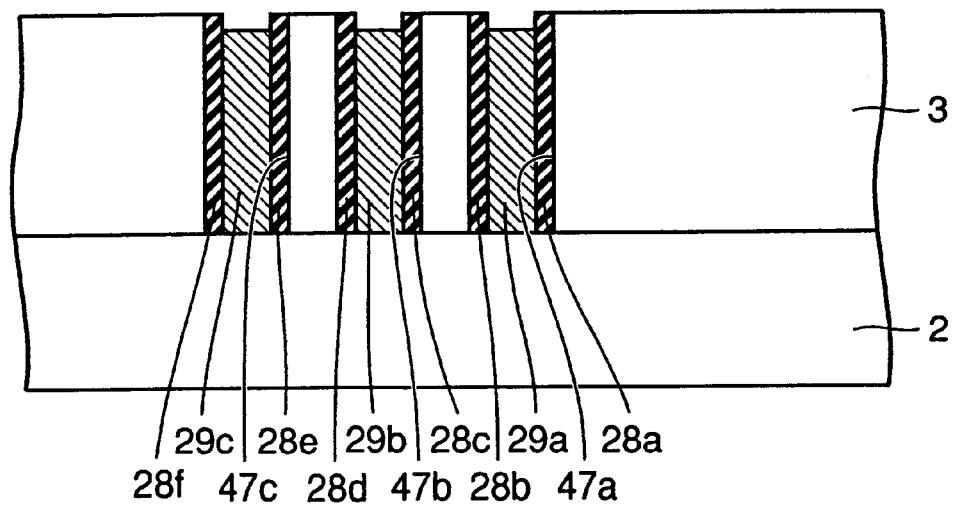

Then, parts of the insulator films 28a to 28f positioned on the SOI layer 3 and the polysilicon film 48 are removed by etching, as shown in FIG. 8. Thus, the polysilicon buried films 29a to 29c are formed in the trenches 47a to 47c.

Figure 9:
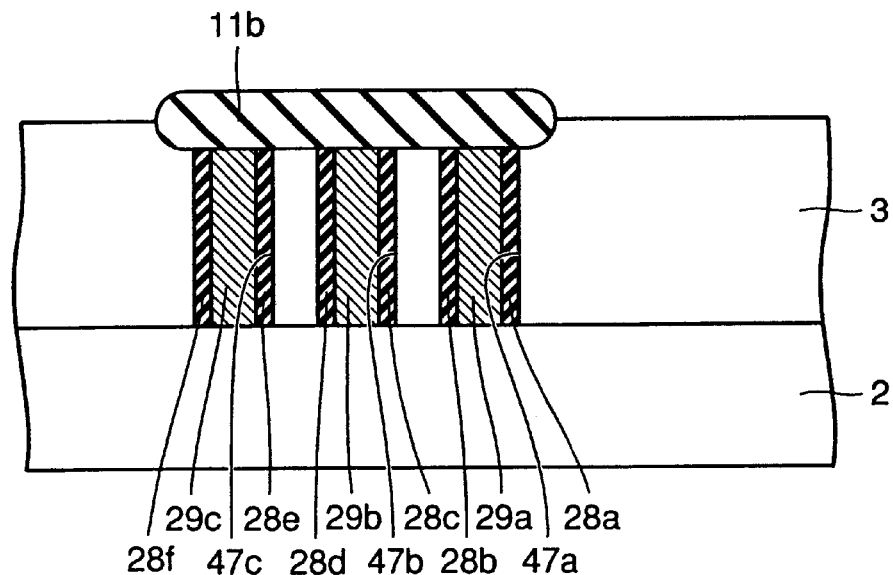

Then, the field oxide film 11b is formed on the surface of the SOI layer 3 in the region positioned on the trenches 47a to 47c, as shown in FIG. 9.

Thereafter the third multi-field plates 30a to 30d, the fourth multi-field plates 32a to 32c and the like are formed on the field oxide film 11b through a step similar to a conventional step for forming the first and second multi-field plates 12a to 12c and 14a to 14d. Thus, the semiconductor device shown in FIG. 3 can be obtained.

Another semiconductor device is now described with reference to FIG. 10.

Figure 10:
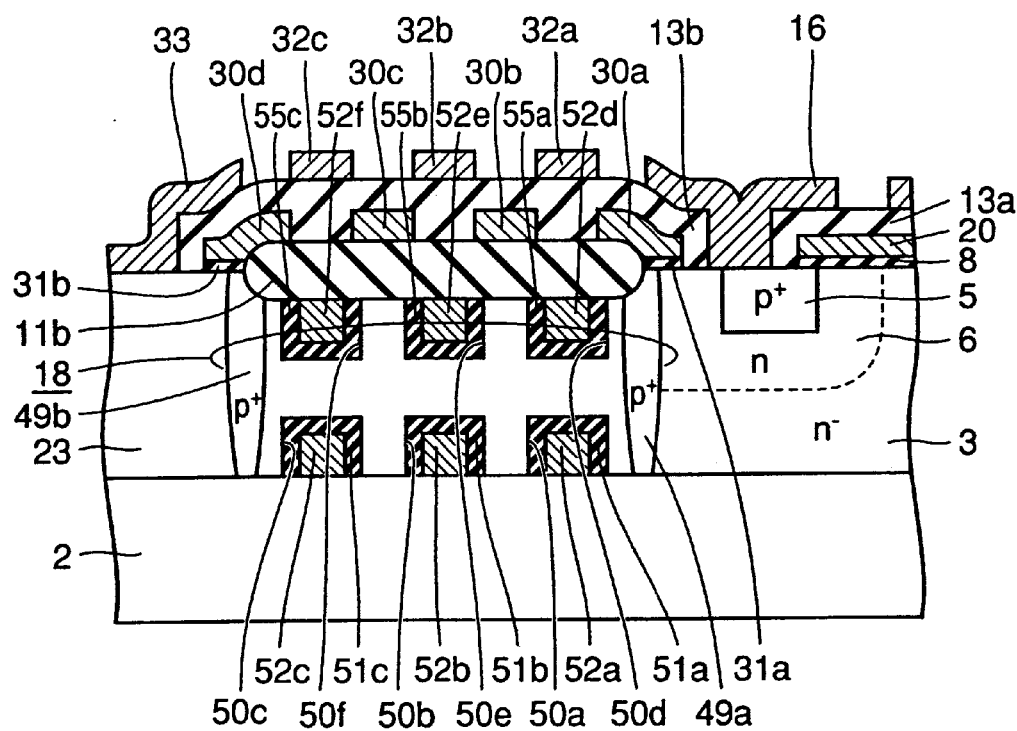
FIG. 10 is a partially enlarged sectional view showing a modification of the semiconductor device according to the embodiment 1 of the present invention.

Referring to FIG. 10, the semiconductor device includes a trench isolation structure 18 for isolating a p-channel LIGBT from an external region 23 similarly to the semiconductor device shown in FIG. 3, and the p-channel LIGBT formed adjacently to the trench isolation structure 18 is basically similar in structure to the p-channel LIGBT shown in FIG. 1. Further, the trench isolation structure 18 formed on a surface of a SOI layer 3 is basically similar in structure to the isolation structure 18 shown in FIG. 3. In the semiconductor device shown in FIG. 10, however, the trench isolation structure 18 includes trenches 50a to 50f formed on upper and lower surfaces of the SOI layer 3 and $p^+$-type diffusion regions 49a and 49b for electrically isolating the device region provided with the p-channel LIGBT from the external region 23. Insulator films 51a to 51c and 55a to 55c are formed in the trenches 50a to 50f. Polysilicon buried films 52a to 52f are formed on the insulator films 51a to 51c and 55a to 55c, to fill up the trenches 50a to 50f.

Therefore, the polysilicon buried films 52a to 52f and the insulator films 51a to 51c and 55a to 55c act as capacitances in an OFF operation of the p-channel LIGBT for forming equipotential surfaces along the insulator films 51a to 51c and 55a to 55c formed on the side walls of the trenches 50a to 50f, whereby an effect similar to that of the trench isolation structure 18 of the semiconductor device shown in FIG. 3 can be attained.

Steps for fabricating the semiconductor device are now described with reference to FIGS. 11 to 17.

Figure 11:
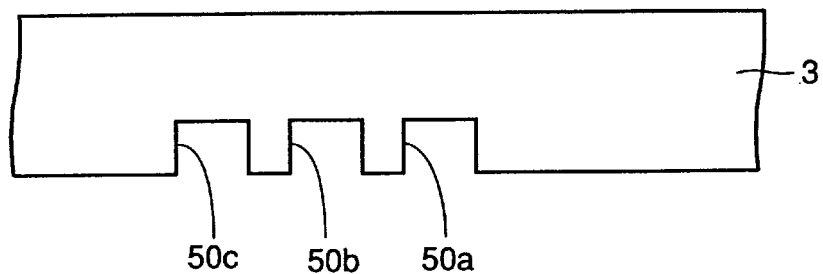
FIGS. 11 to 17 are sectional views for illustrating first to seventh steps for fabricating the semiconductor device shown in FIG. 10.

As shown in FIG. 11, a resist pattern (not shown) is first formed on a lower surface of a semiconductor substrate 3 (hereinafter referred to as the SOI layer 3) for defining the $n^-$-type SOI layer 3. The resist pattern is employed as a mask for partially removing the SOI layer 3 by anisotropic etching, thereby forming the trenches 50a to 50c. Thereafter the resist pattern is removed.

Figure 12:
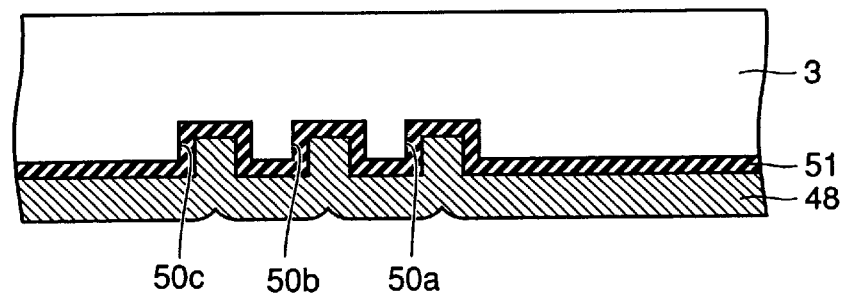

Then, an insulator film 51 is formed on the lower surface of the SOI layer 3 and in the trenches 50a to 50c, as shown in FIG. 12. A polysilicon film 48 is formed on the insulator film 51.

Figure 13:
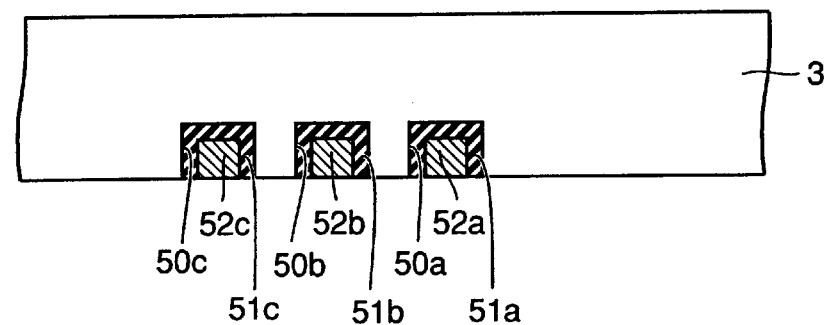

Then, parts of the insulator film 51 and the polysilicon film 48 positioned on the lower surface of the SOI layer 3 are removed by etching, as shown in FIG. 13.

Figure 14:
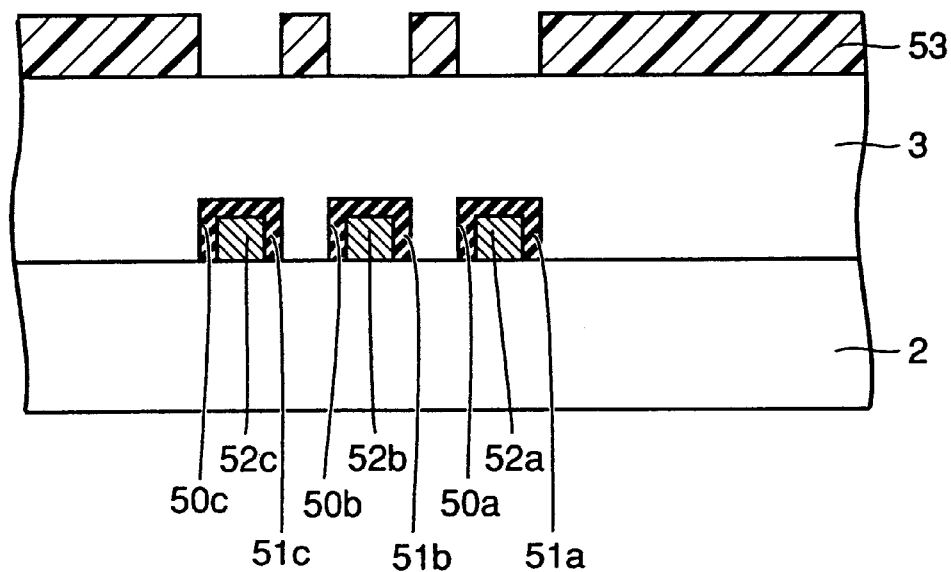

Then, a semiconductor substrate (not shown) provided with a buried oxide film 2 is bonded to the lower surface of the SOI layer 3, as shown in FIG. 14. A resist pattern 53 is formed on an upper surface of the SOI layer 3.

Figure 15:
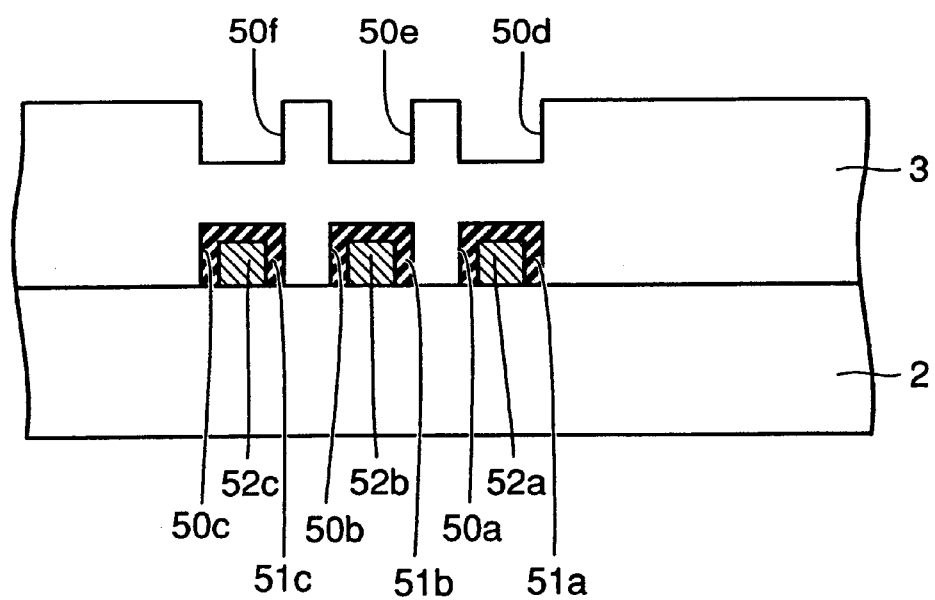

Then, the resist pattern 53 (see FIG. 14) is employed as a mask for partially removing the SOI layer 3 by etching, thereby forming the trenches 50d to 50f, as shown in FIG. 15. Thereafter the resist pattern 53 is removed.

Figure 16:
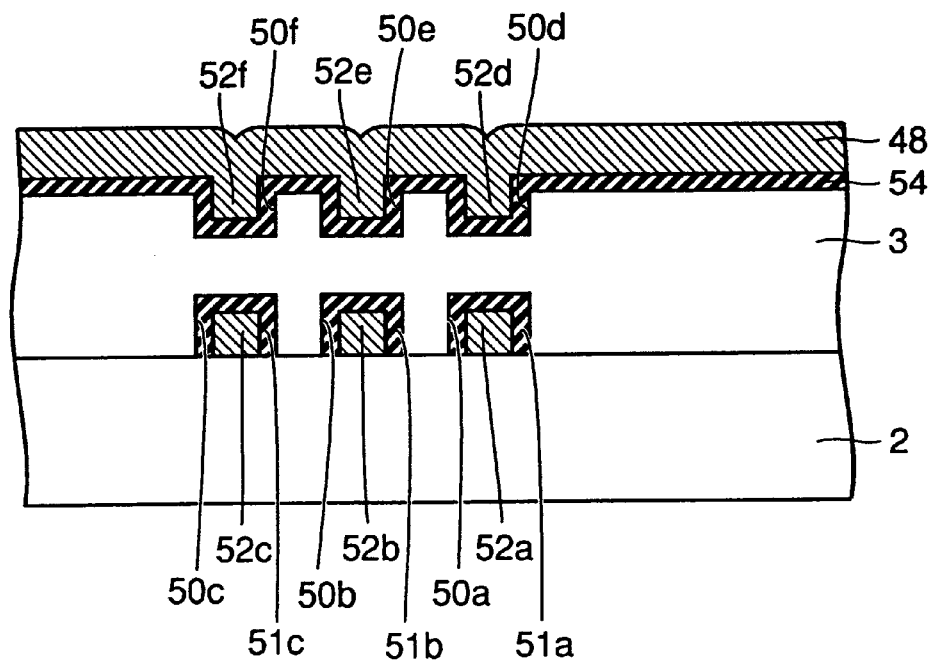

Then, an insulator film 54 is formed on the upper surface of the SOI layer 3 and in the trenches 50d to 50f, as shown in FIG. 16. A polysilicon film 48 is formed on the insulator film 54.

Figure 17:
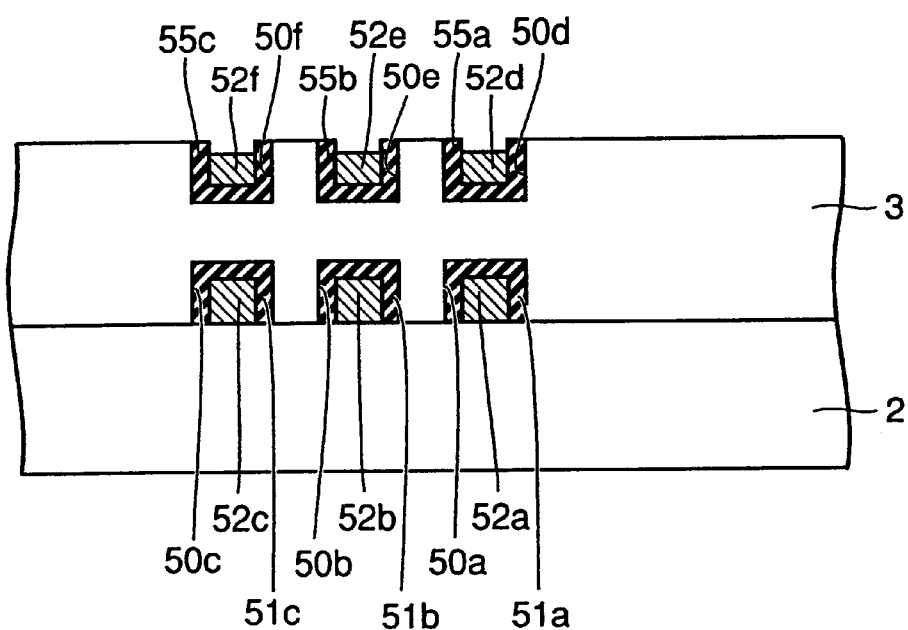

Then, parts of the insulator film 54 and the polysilicon film 48 positioned on the upper surface of the SOI layer 3 are removed by etching, as shown in FIG. 17. Thus, the insulator films 55a to 55c and the polysilicon buried films 52d to 52f are formed in the trenches 50d to 50f.

Thereafter $p^+$-type diffusion regions 49a and 49b (see FIG. 10), a field oxide film 11b and the like are formed thereby obtaining the semiconductor device shown in FIG. 10.

(Embodiment 2)

Figure 18:
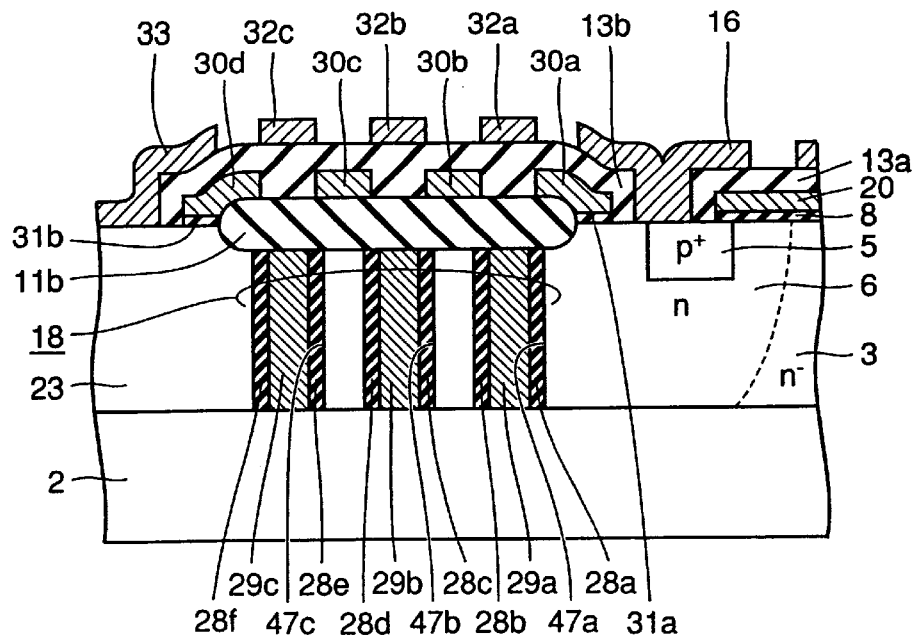
FIG. 18 is a partially enlarged sectional view showing a semiconductor device according to an embodiment 2 of the present invention.

Referring to FIG. 18, the semiconductor device is basically similar in structure to the semiconductor device according to the embodiment 1 of the present invention shown in FIG. 3. In the semiconductor device shown in FIG. 18, however, an n-type emitter diffusion region 6 is formed to be in contact with a buried oxide film 2.

An action in an OFF operation of the semiconductor device shown in FIG. 18 is described with reference to FIG. 19.

Figure 19:
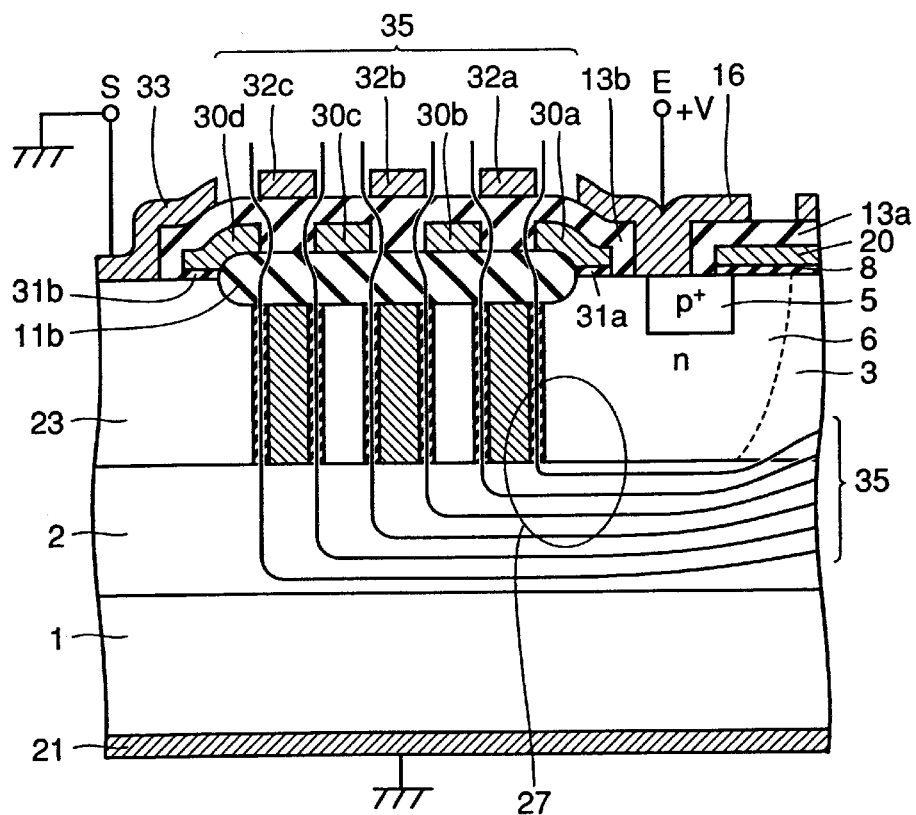
FIG. 19 is a typical sectional view for illustrating an OFF operation of the semiconductor device shown in FIG. 18.

Referring to FIG. 19, the semiconductor device, having a trench isolation structure 18 basically similar in structure to that of the semiconductor device according to the embodiment 1 of the present invention shown in FIG. 3, can attain an effect similar to that of the semiconductor device according to the embodiment 1. The n-type emitter diffusion region 6 is formed to be in contact with the buried oxide film 2, whereby a depletion layer formed in the body of a p-channel LIGBT cannot penetrate a region 27 close to the interface between the trench isolation structure 18 and an SOI layer 3. On a portion under an emitter electrode 16, therefore, a potential 35 is distributed as if pushed out from the SOI layer 3 to a buried oxide film 2. Therefore, local electric field concentration can be more reliably prevented in the region 27 close to the interface.

(Embodiment 3)

Figure 20:
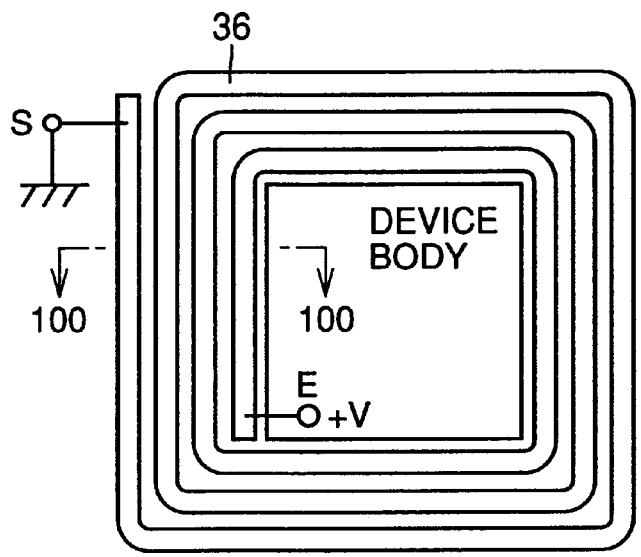
FIG. 20 is a typical plan view showing a semiconductor device according ton an embodiment 3 of the present invention.
Figure 21:
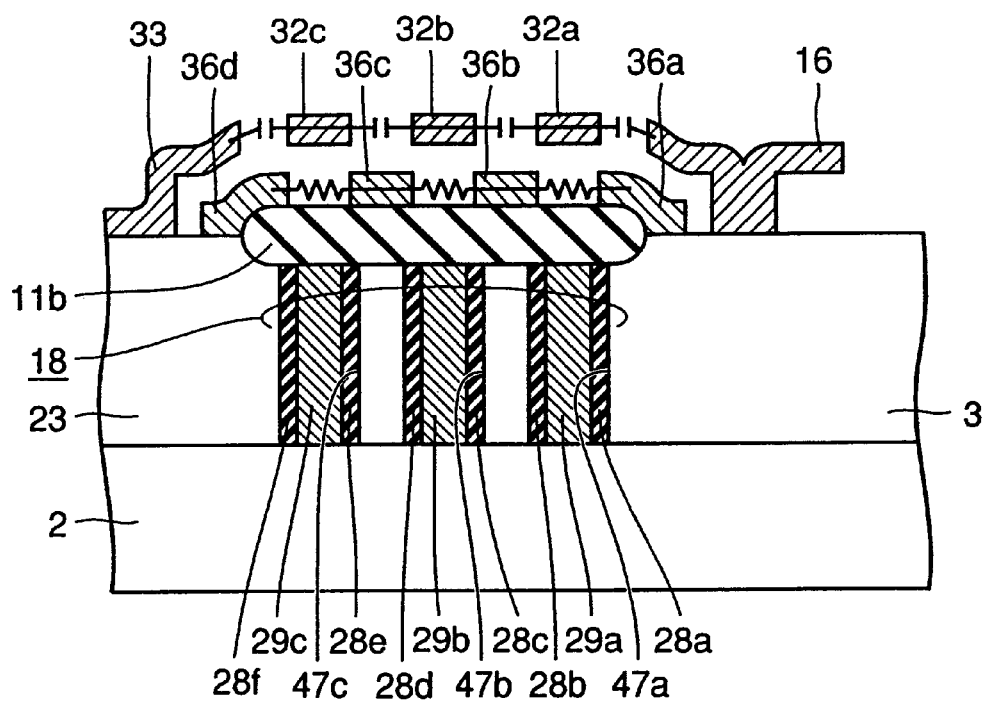
FIG. 21 is a typical sectional view taken along the line 100—100 in FIG. 20.

Referring to FIG. 20, the semiconductor device includes an integral spiral field plate structure 36 for an isolation structure 18 thereof. A device enclosed with the integral spiral field plate structure 36 is a p-channel LIGBT, similarly to the semiconductor device according to the embodiment 1 of the present invention. The trench isolation structure 18 (see FIG. 21) is formed to enclose the p-channel LIGBT. The integral spiral field plate structure 36 is formed on the trench isolation structure 18. Multi-field plates 32a to 32c (see FIG. 21) are formed on the integral spiral field plate structure 36, similarly to the semiconductor device shown in FIG. 3.

The integral spiral field plate structure 36 is formed by a thin conductor film of high resistance such as a silicon film having a high nitrogen content, for example. An inner peripheral end of the integral spiral field plate structure 36 is electrically connected with an electrode of the device body such as an emitter electrode 16 (see FIG. 21) of the p-channel LIGBT, for example. On the other hand, an outer peripheral end of the integral spiral field plate structure 36 is electrically connected with an external region 23 and maintained at a ground potential in an OFF operation of the semiconductor device.

Thus, the integral spiral field plate structure 36 is formed by the thin conductor film of high resistance, whereby potentials on respective positions of integral spiral field plate structures 36a to 36d (see FIG. 21) can be decided from the resistance value of the thin conductor film and the distances from the internal peripheral end of the integral spiral field plate structure 36. Also when a potential is formed in the trench isolation structure 18 in the OFF operation of the semiconductor device, therefore, the position of an equipotential surface thereof can be forcibly fixed by the respective potentials of the integral spiral field plate structures 36a to 36d (this function is hereinafter referred to as resistive potential division). Even if conductive foreign matter or the like is present in the vicinity of the integral spiral field plate structures 36a to 36d, therefore, the position of the equipotential surface of the potential is hardly influenced. Even if electrical noise or the like is externally applied, further, the position of the equipotential surface of the potential can be more stabilized as compared with multi-field plates such as the third and fourth multi-field plates 30a to 30d and 32a to 32c having capacitive potential dividing functions.

Further, multi-field plates 32a to 32c having a capacitive potential dividing function are formed on the integral spiral field plate structures 36a to 36d having the resistive potential dividing function through an insulator film (not shown). Thus, the semiconductor device can more reliably homogenize the potential profile as compared with the semiconductor device according to the embodiment 1 of the present invention employing only the multi-field plates 30a to 30d and 32a to 32c having the capacitive potential dividing function, due to the employment of the field plate structures 36a to 36d having the resistive potential dividing function and the multi-field plate structures 32a to 32c having the capacitive potential dividing function.

While the multi-field plates 32a to 32c having the capacitive potential dividing function hardly cause a leakage current since the device region therefor is insulated from the external region 23, the degree of freedom for the layout thereof is relatively inferior to that of the field plate structure 36 having the resistive potential dividing function. On the other hand, the integral spiral field plate structures 36a to 36d having the resistive potential dividing function cause a leakage current since the device region therefor is not completely insulated from the external region 23 although the position of the equipotential surface can be controlled by adjusting the resistance value of the material therefor or the like and the degree of freedom for the layout thereof can be increased. Thus, an isolation structure applicable to various required characteristics can be readily obtained by employing field plate structures having different characteristics.

Although an integral resistive field plate structure connected between electrodes of a device for facilitating a RESURF effect in the device has been proposed (K. Endo, Y. Baba, Y. Udo, M. Yasui and Y. Sano, "A 500 V 1A 1-Chip Inverter IC with a New Electric Field Reduction Structure" ISPSD 94, pp. 379–383 (1994)), there has been proposed no structure connecting one main electrode of a device with an external electrode on a trench isolation structure.

(Embodiment 4)

Figure 22:
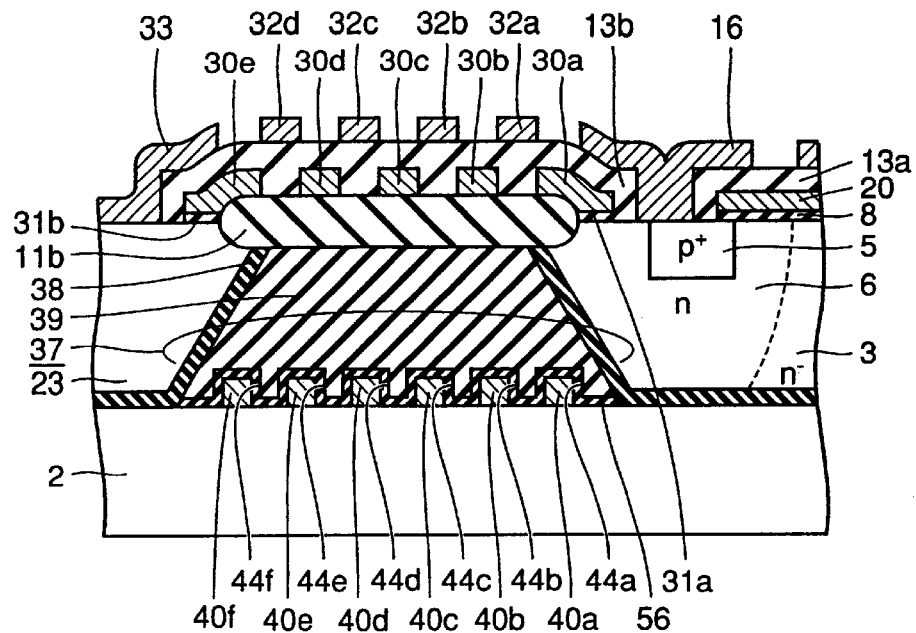
FIG. 22 is a partially enlarged sectional view showing a semiconductor device according to an embodiment 4 of the present invention.

Referring to FIG. 22, the semiconductor device is basically similar in structure to the semiconductor device shown in FIG. 18. In this semiconductor device, however, an inverted V-shaped isolation structure 37 is formed under a field oxide film 11b. The inverted V-shaped isolation structure 37 includes side wall insulator films 38, a buried insulator film 39 and fifth multi-field plates 40a to 40f. The side wall insulator films 38 are formed on side surfaces of a trench formed under the field oxide film 11b. The buried insulator film 39 is formed on the side wall insulator films 38, to fill up the trench. Trenches 44a to 44f are formed on a lower surface of the buried insulator film 39. An insulator film 56 is formed on the lower surface of the buried insulator film 39 and in the trenches 44a to 44f. The fifth multi-field plates 40a to 40f are formed by conductor films to fill up the trenches 44a to 44f. The fifth multi-field plates 40a to 40f are electrically insulated from each other, and have a capacitive potential dividing function similarly to the first to fourth multi-field plates 12a to 12c, 14a to 14d, 30a to 30d and 32a to 32c of the semiconductor device according to the embodiment 1 of the present invention.

An OFF operation of the semiconductor device shown in FIG. 22 is now described with reference to FIG. 23.

Figure 23:
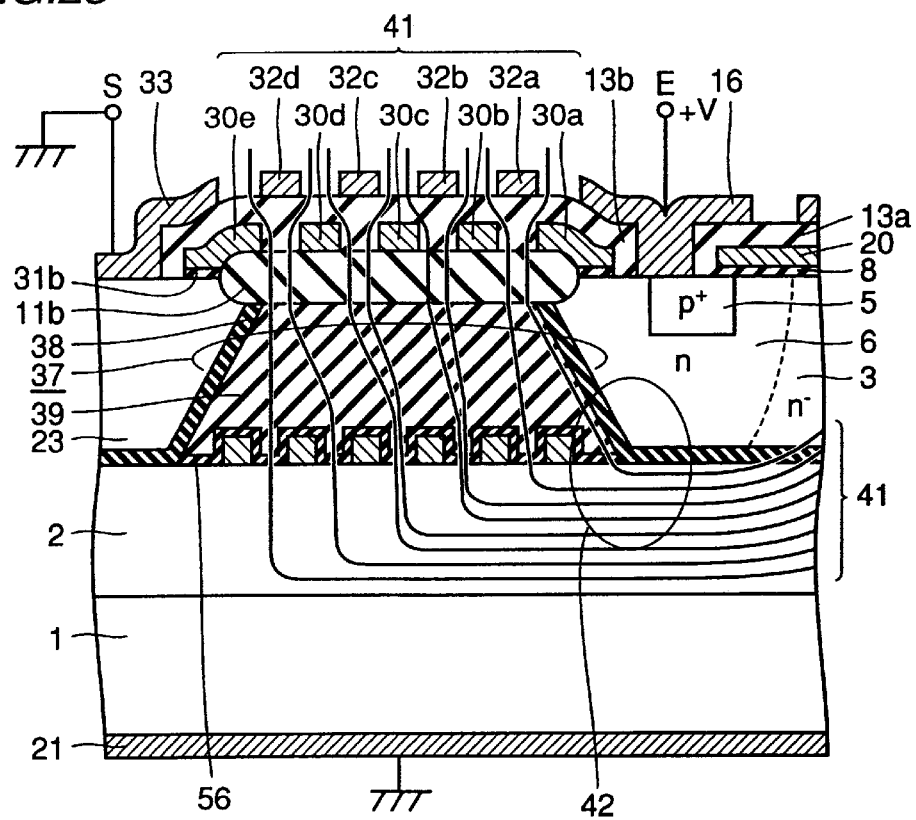
FIG. 23 is a typical sectional view for illustrating an OFF operation of the semiconductor device shown in FIG. 22.

Referring to FIG. 23, potential states of an emitter electrode 16, a back electrode 21 and the like are basically similar to those in the OFF operation of the semiconductor device according to the embodiment 1 of the present invention shown in FIG. 4. The semiconductor device can attain an effect similar to that of the semiconductor device according to the embodiment 2 of the present invention, due to the capacitive potential dividing function of the fifth multi-field plates 40a to 40f. In the inverted V-shaped isolation structure 37, the buried insulator film 39 has a lower surface wider than the upper surface, and hence the number of the fifth multi-field plates 40a to 40f can be increased without changing the structure on the field oxide film 11b. On the lower surface of the buried insulator film 39, therefore, an equipotential surface of a potential 41 can be divided into a larger number, thereby more reliably preventing local electric field concentration in a region 42 close to the interface between the inverted V-shaped isolation structure 37 and an SOI layer 3. Therefore, deterioration of breakdown voltage in the OFF operation of the semiconductor device can be more reliably prevented.

Steps for fabricating the semiconductor device are now described with reference to FIGS. 24 to 31.

Figure 24:
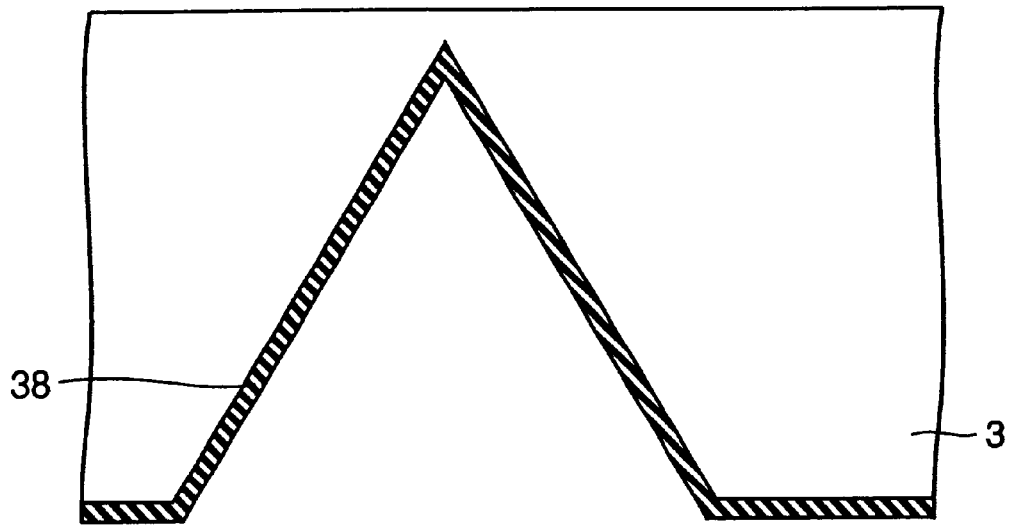
FIGS. 24 to 31 are sectional views for illustrating first to eighth steps for fabricating the semiconductor device shown in FIG. 22.

First, an inverted V-shaped trench is formed on a lower surface of the SOI layer 3 by anisotropic etching employing KOH or the like, as shown in FIG. 24. The lower surface of the SOI layer 3 and the internal surface of the trench are thermally oxidized for forming a side wall insulator film 38.

Figure 25:
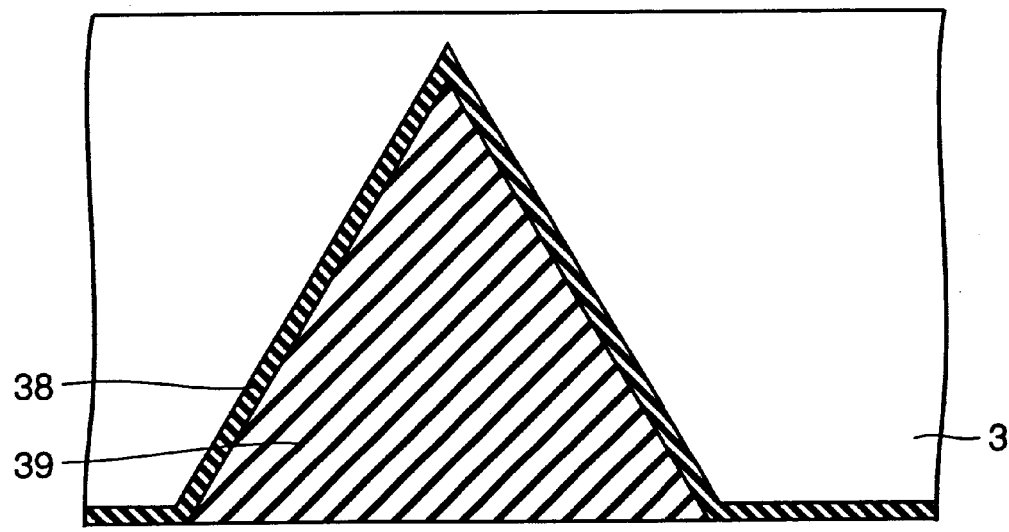

Then, an insulator film of BPSG or TEOS is deposited on the side wall insulator film 38 and thereafter flattened for forming the buried insulator film 39, as shown in FIG. 25. The lower surface of the buried insulator film 39 is substantially flush with that of the side wall insulator film 38 positioned on the lower surface of the SOI layer 3.

Figure 26:
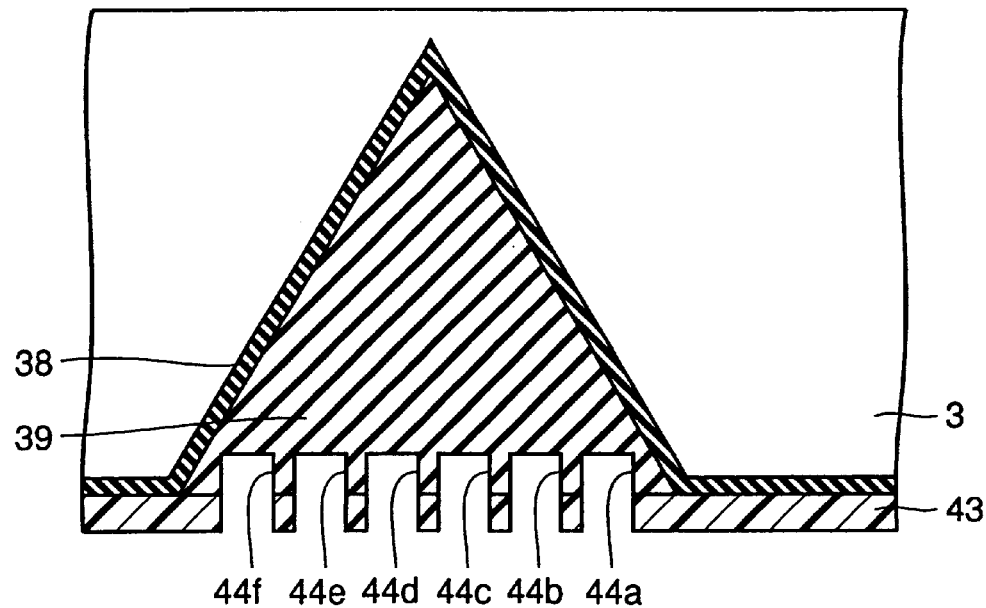

Then, a resist pattern 43 is formed on the lower surfaces of the side wall insulator film 38 and the buried insulator film 39, as shown in FIG. 26. The resist pattern 43 is employed as a mask for partially removing the buried insulator film 39 by anisotropic etching, thereby forming the trenches 44a to 44f.

Figure 27:
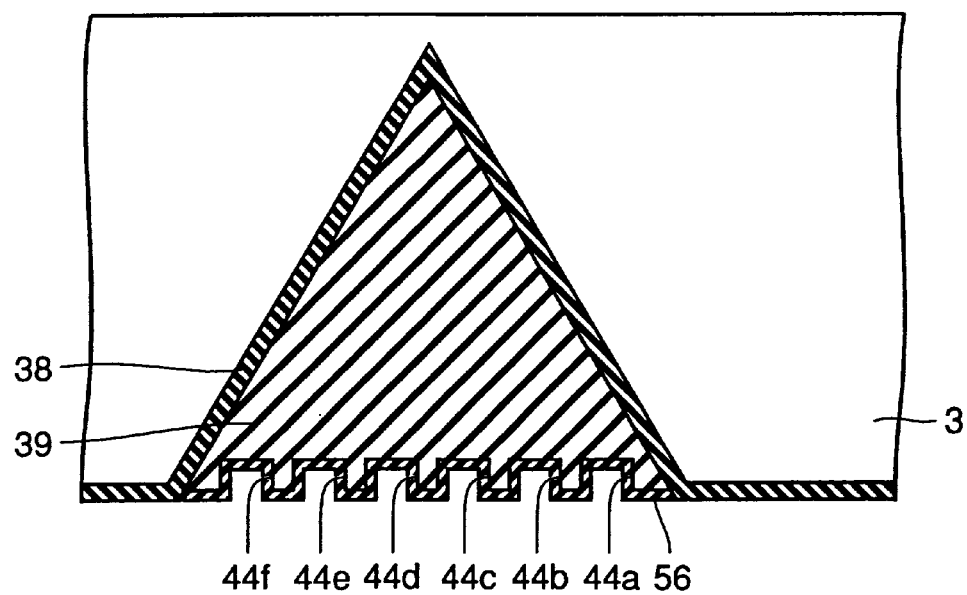

Then, the resist pattern 43 (see FIG. 26) is removed and thereafter an insulator film 56 is formed on the lower surface of the buried insulator film 39 and in the trenches 44a to 44f, as shown in FIG. 27.

Figure 28:
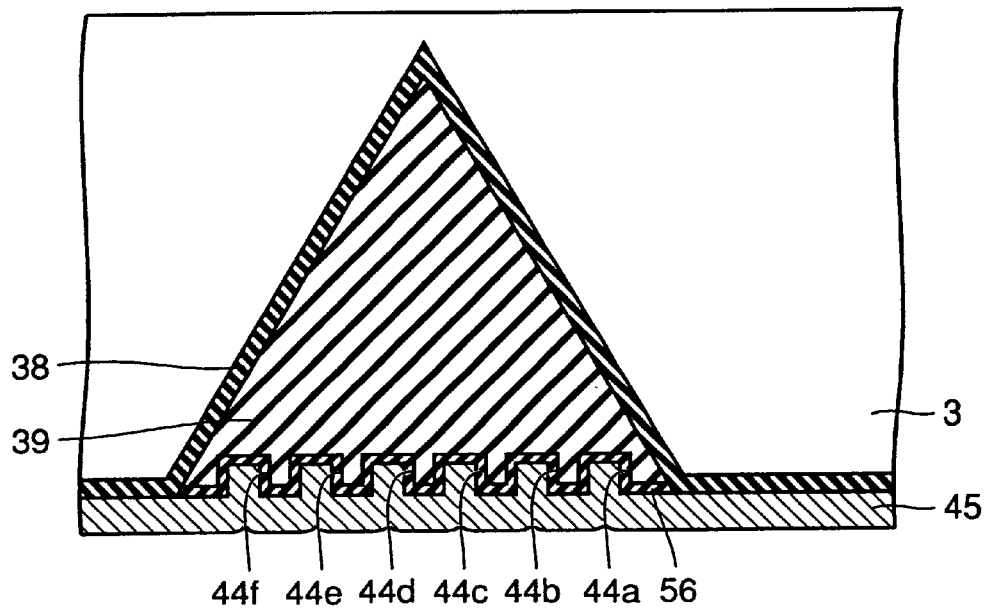

Then, a doped polysilicon film 45 is formed on the lower surface of the side wall insulator film 38 and on the insulator film 56, as shown in FIG. 28.

Figure 29:
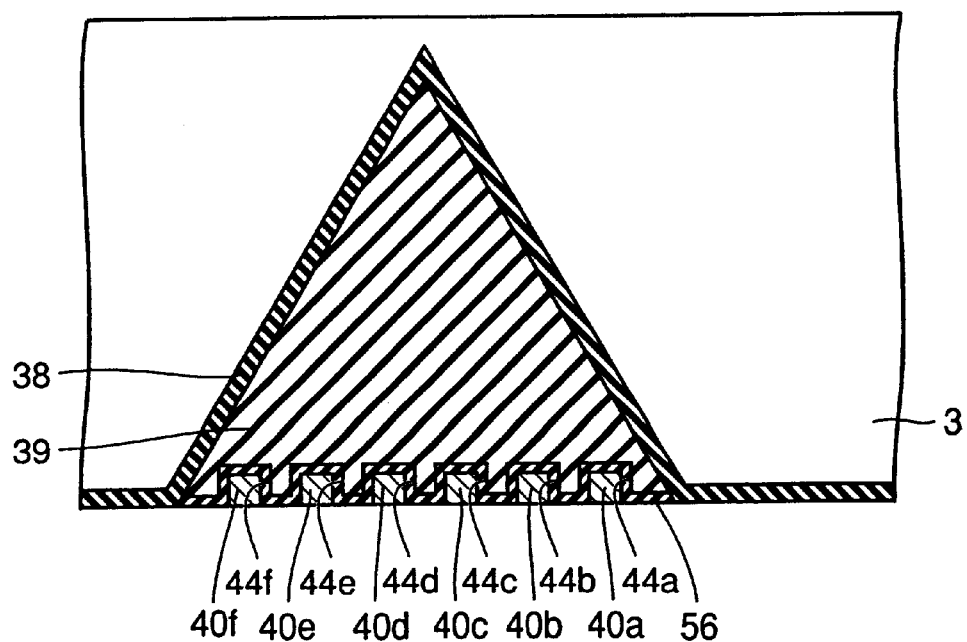

Then, a flattening step is carried out thereby forming the fifth multi-field plates 40a to 40f, as shown in FIG. 29. At this time, the lower surface of the side wall insulator film 38 and those of the fifth multi-field plates 40*a* to 40*f* are flattened to be substantially flush with each other.

Figure 30:
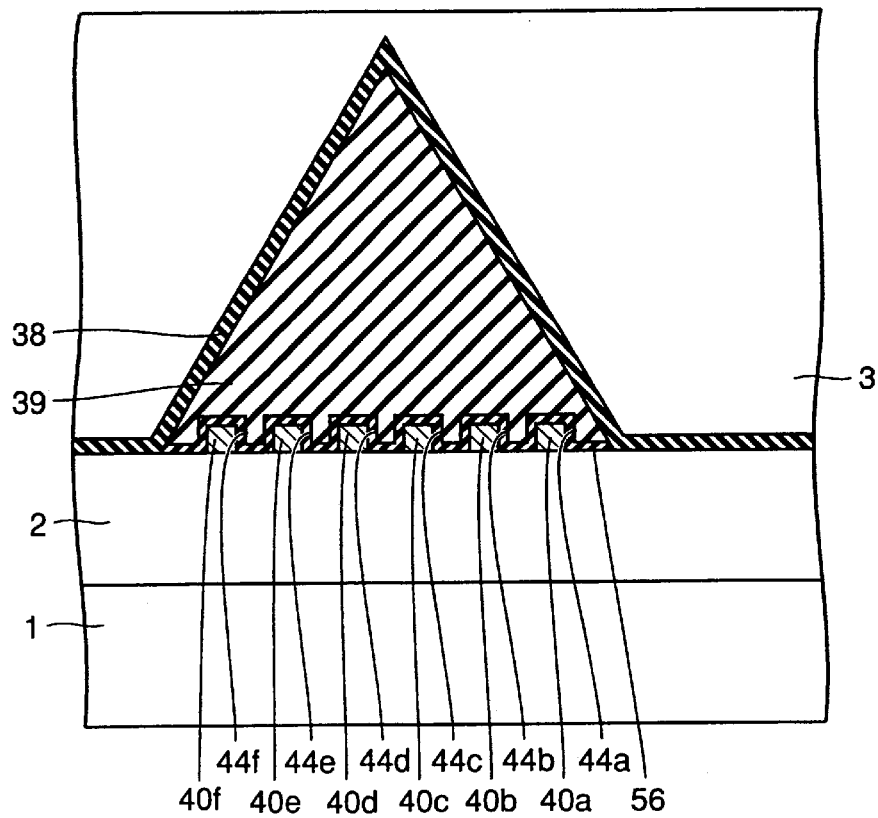

Then, a semiconductor substrate 1 provided with a buried oxide film 2 is bonded to the lower surface of the SOI layer 3, as shown in FIG. 30. The bond strength is improved by heat treatment at a high temperature of about 1100 to 1200° C.

Figure 31:
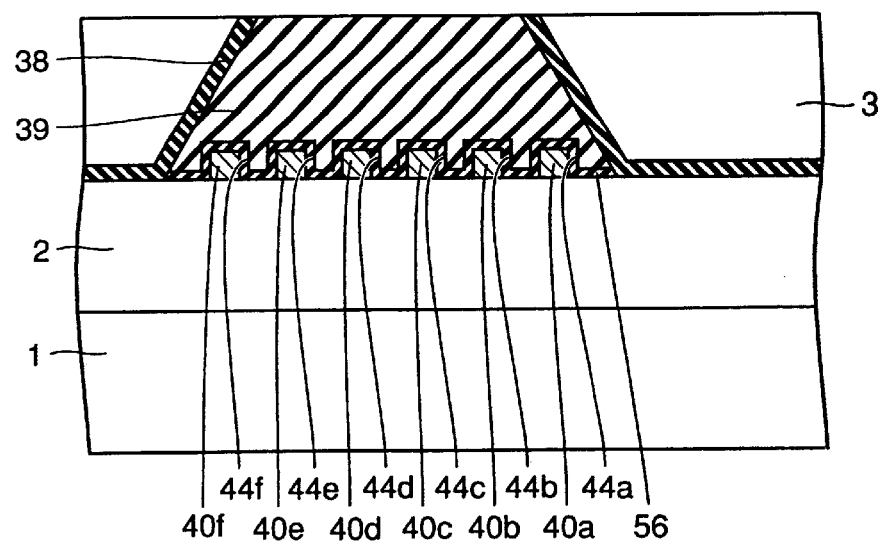

Then, the upper surface of the SOI layer 3 is polished for adjusting the SOI layer 3 to a prescribed thickness, as shown in FIG. 31.

Thereafter the field oxide film 11*b* (see FIG. 22) and the like are formed to obtain the semiconductor device shown in FIG. 22.

(Embodiment 5)

Figure 32:
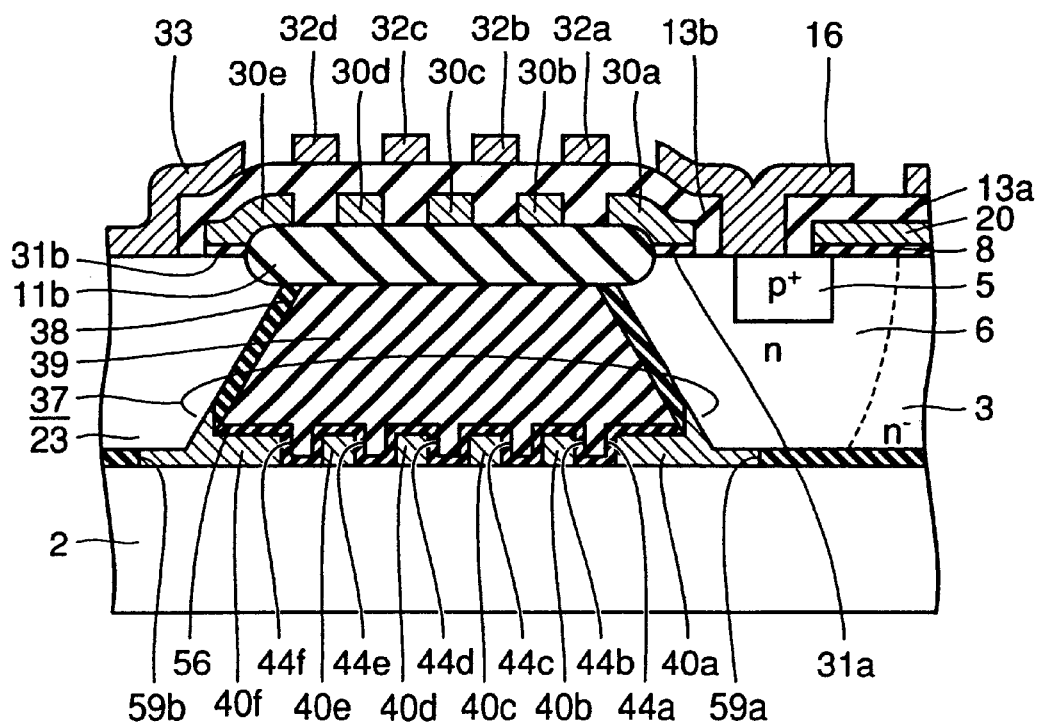
FIG. 32 is a partially enlarged sectional view showing a semiconductor device according to an embodiment 5 of the present invention.
Figure 33:
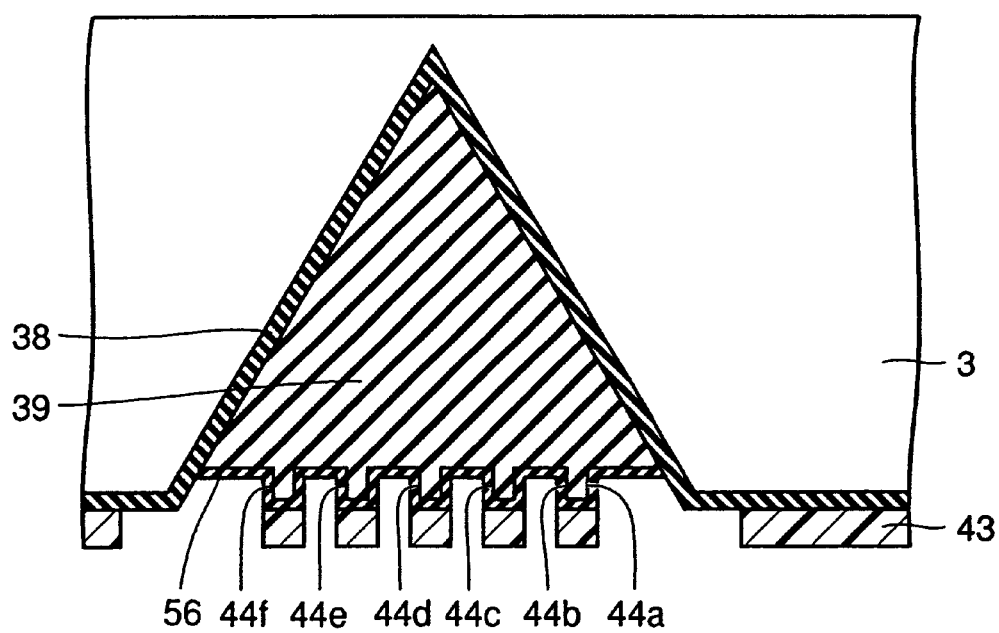
FIGS. 33 to 38 are sectional views for illustrating first to sixth steps for fabricating the semiconductor device shown in FIG. 32.

Referring to FIG. 32, the semiconductor device is basically identical in structure to the semiconductor device according to the embodiment 4 of the present invention shown in FIG. 22. In the semiconductor device shown in FIG. 32, however, fifth multi-field plates 40*a* to 40*f* formed on a bottom portion of an inverted V-shaped isolation structure 37 have a resistive potential dividing function. The fifth multi-field plates 40*a* to 40*f* are similar in plane shape to the integral spiral field plate structure 36 in the semiconductor device according to the embodiment 3 shown in FIG. 20, and the multi-field plate 40*a* corresponding to an inner peripheral end of the fifth multi-field plates 40*a* to 40*f* is electrically connected with an n-type emitter diffusion region 6. The multi-field plate 40*f* corresponding to an outer peripheral end of the fifth multi-field plates 40*a* to 40*f* is electrically connected with an external region 23. The fifth multi-field plates 40*a* to 40*f* are made of a conductor of high resistance such as silicon having a high nitrogen content, for example.

Therefore, the semiconductor device shown in FIG. 32 can attain an effect similar to that of the integral spiral field plate structures 36*a* to 36*d* of the semiconductor device according to the embodiment 3 of the present invention, in addition to an effect similar to that of the semiconductor device according to the embodiment 4 shown in FIG. 22.

Steps for fabricating the semiconductor device are now described with reference to FIGS. 33 to 38.

First, steps similar to those for fabricating the semiconductor device according to the embodiment 4 of the present invention shown in FIGS. 24 and 25 are carried out and thereafter a resist pattern 43 is formed on a side wall insulator film 38 and a lower surface of a buried insulator film 39. This resist pattern 43 is employed as a mask for partially removing the buried insulator film 39 by etching. Thus, trenches 44*a* to 44*f* are formed.

Figure 34:
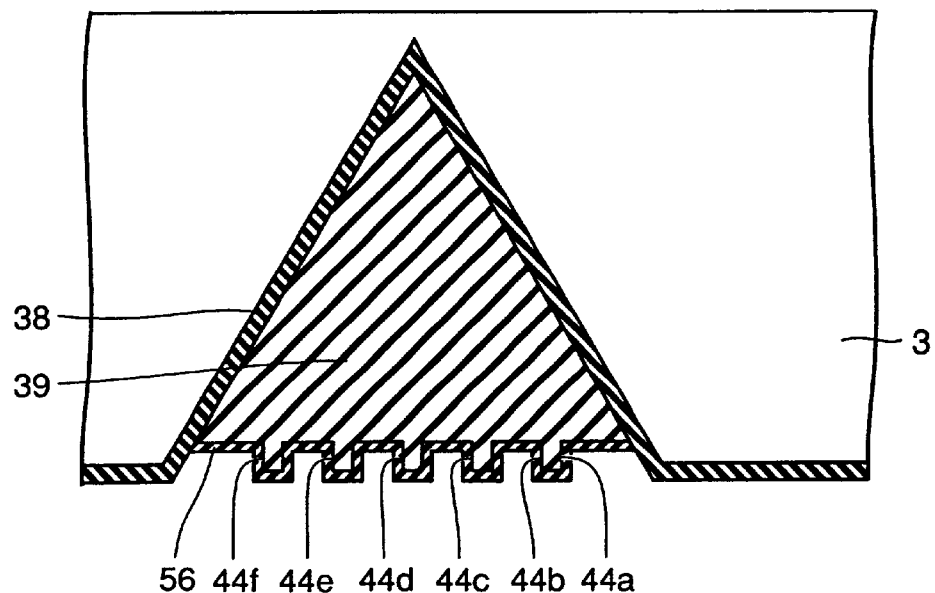

Then, the resist pattern 43 (see FIG. 33) is removed and an insulator film 56 is formed on the lower surface of the buried insulator film 39 and in the trenches 44*a* to 44*f*, as shown in FIG. 34.

Figure 35:
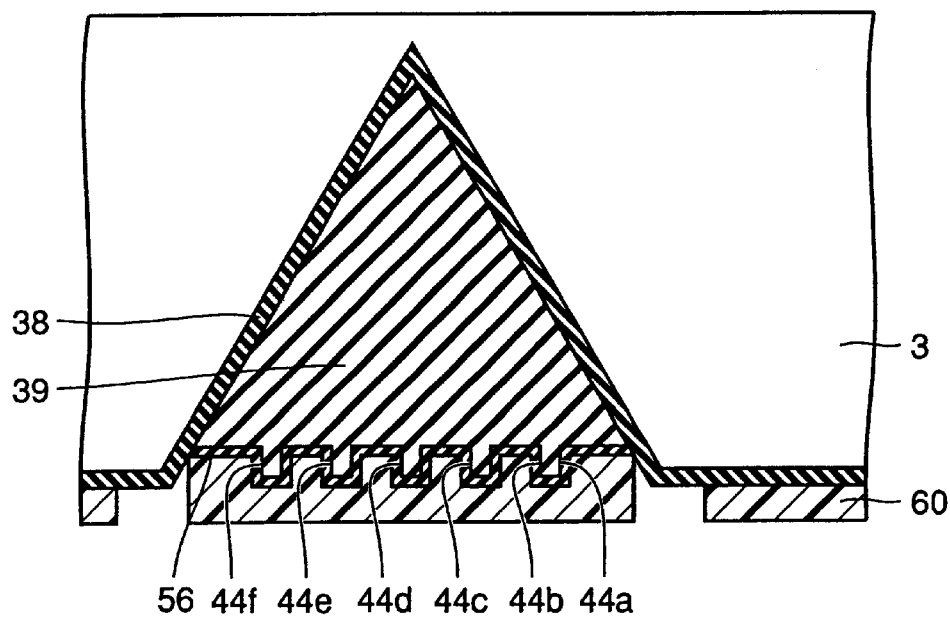

Then, a resist pattern 60 is formed on the side wall insulator film 38 and the insulator film 56, as shown in FIG. 35.

Figure 36:
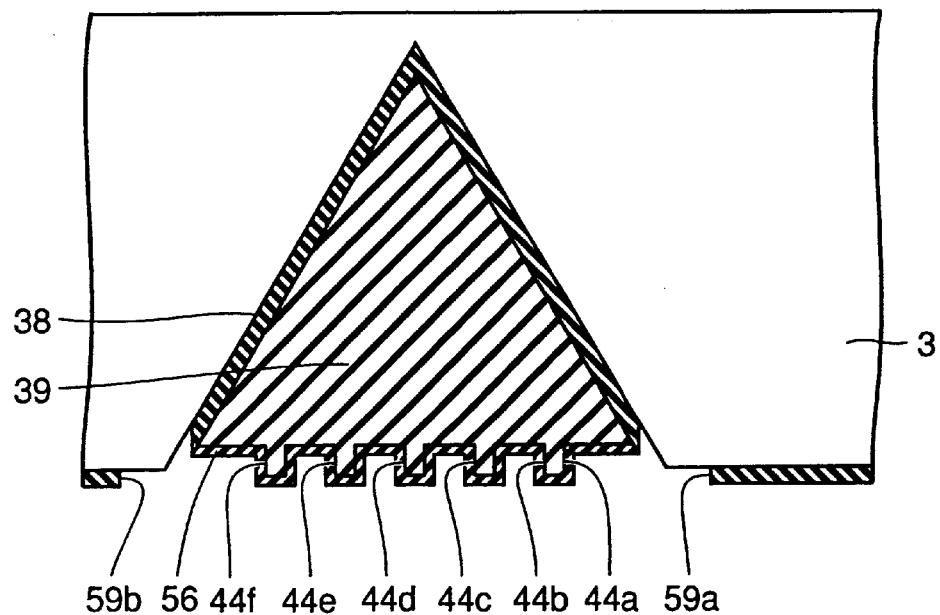

Then, the resist pattern 60 is employed as a mask for partially removing the side wall insulator film 38 by etching, as shown in FIG. 36. Thus, openings 59*a* and 59*b* are formed in the side wall insulator film 38. Thereafter the resist pattern 60 is removed.

Figure 37:
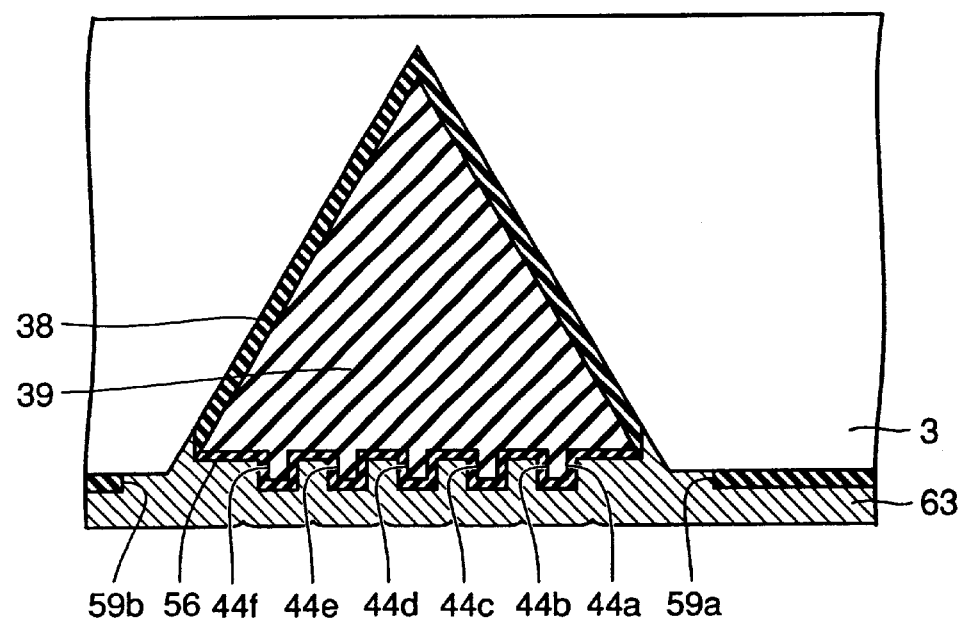

Then, a silicon film 63 containing a large amount of nitrogen is formed to fill up the trenches 44*a* to 44*f*, as shown in FIG. 37.

Figure 38:
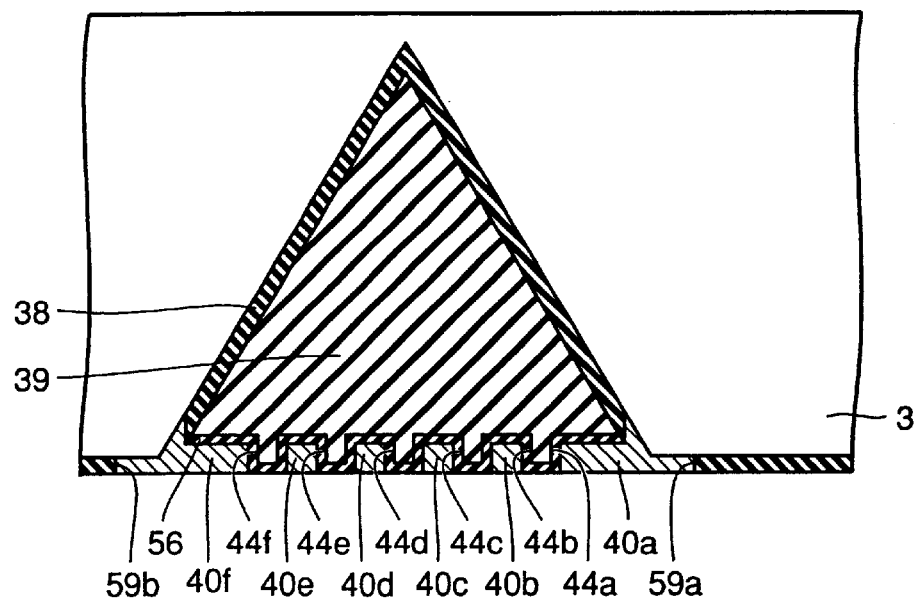

Then, a flattening step is carried out for forming the fifth multi-field plates 40*a* to 40*f* having the resistive potential dividing function, as shown in FIG. 38.

Thereafter steps similar to those for the semiconductor device according to the embodiment 4 shown in FIGS. 30 and 31 are carried out, thereby obtaining the semiconductor device shown in FIG. 32.

(Embodiment 6)

Figure 39:
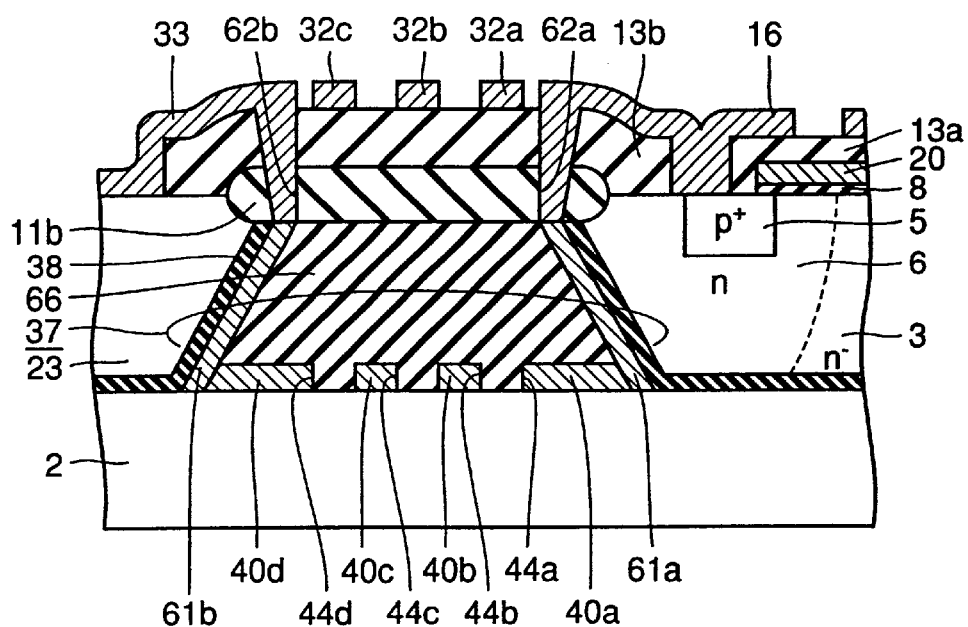
FIG. 39 is a partially enlarged sectional view showing a semiconductor device according to an embodiment 6 of the present invention.

Referring to FIG. 39, the semiconductor device is basically similar in structure to that shown in FIG. 32. In the semiconductor device shown in FIG. 39, however, an inner peripheral end 40*a* of fifth multi-field plates having a resistive potential dividing function is electrically connected with an emitter electrode 16 through a polysilicon film 61*a* in an inverted V-shaped isolation structure 37. An outer peripheral end 40*d* of the fifth multi-field plates is electrically connected with a terminal component 33 of fourth multi-field plates through a polysilicon film 61*b*. The terminal component 33 of the fourth multi-field plates is electrically connected with an external region 23. In more concrete terms, the emitter electrode 16 and the terminal component 33 of the fourth multi-field plates are formed to extend into openings 62*a* and 62*b* formed by partially removing an interlayer insulator film 13*b* and a field oxide film 11*b*. The emitter electrode 16 is electrically connected with the polysilicon film 61*a* on the bottom portion of the opening 62*a*. Further, the terminal component 33 of the fourth multi-field plates is electrically connected with the polysilicon film 61*b* on the bottom portion of the opening 62*b*.

Thus, the semiconductor device having the aforementioned structure can attain an effect similar to that of the semiconductor device according to the embodiment 5 of the present invention shown in FIG. 32.

A buried insulator film 66 is formed in an inverted V-shaped trench.

Steps for fabricating the semiconductor device are now described with reference to FIGS. 40 to 43.

Figure 40:
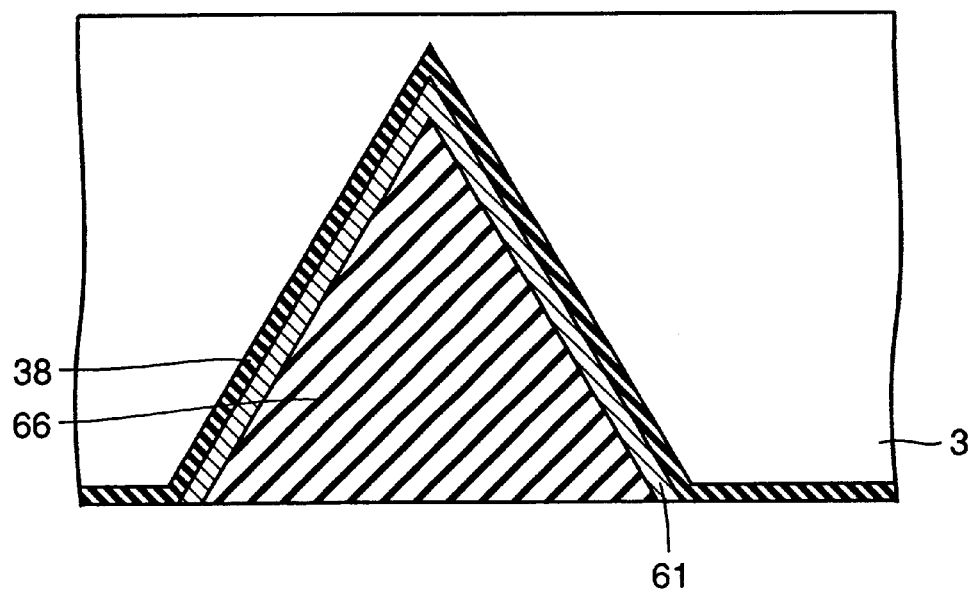
FIGS. 40 to 43 are sectional views for illustrating first to fourth steps for fabricating the semiconductor device shown in FIG. 39.

First, a trench is formed on a lower surface of an SOI layer 3 by anisotropic etching employing KOH or the like, as shown in FIG. 40. A side wall insulator film 38 is formed on the lower surface of the SOI layer 3 and in the trench. A polysilicon film 61 is formed on the side wall insulator film 38. The buried insulator film 66 is formed on the polysilicon film 61. A flattening step is carried out to obtain the structure shown in FIG. 40.

Figure 41:
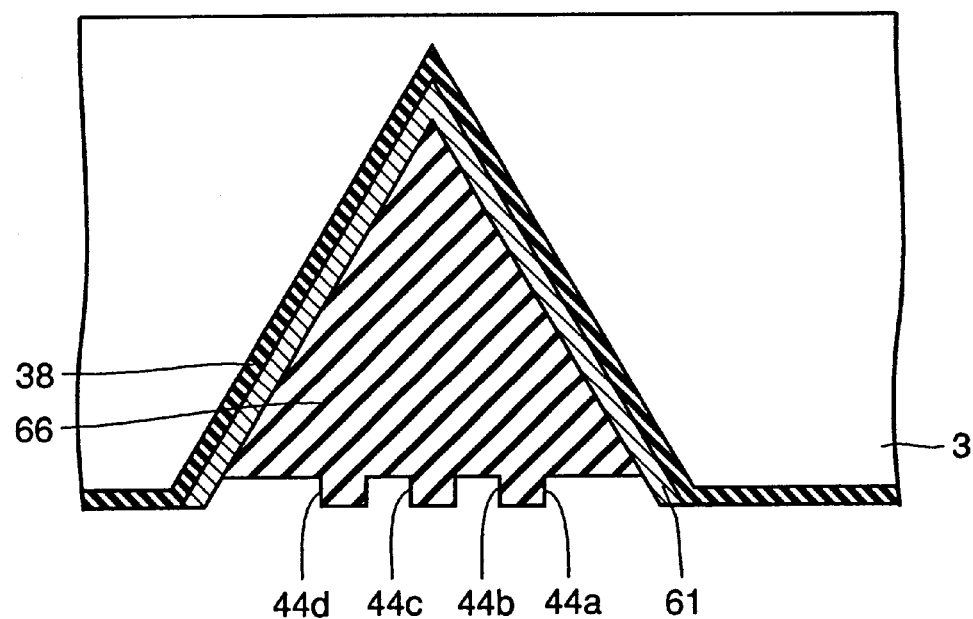

Then, a resist pattern (not shown) is formed on lower surfaces of the side wall insulator film 38 and the buried insulator film 66. This resist pattern is employed as a mask for partially removing the buried insulator film 66, thereby forming trenches 44*a* to 44*d*. Thus, the structure shown in FIG. 41 is obtained.

Figure 42:
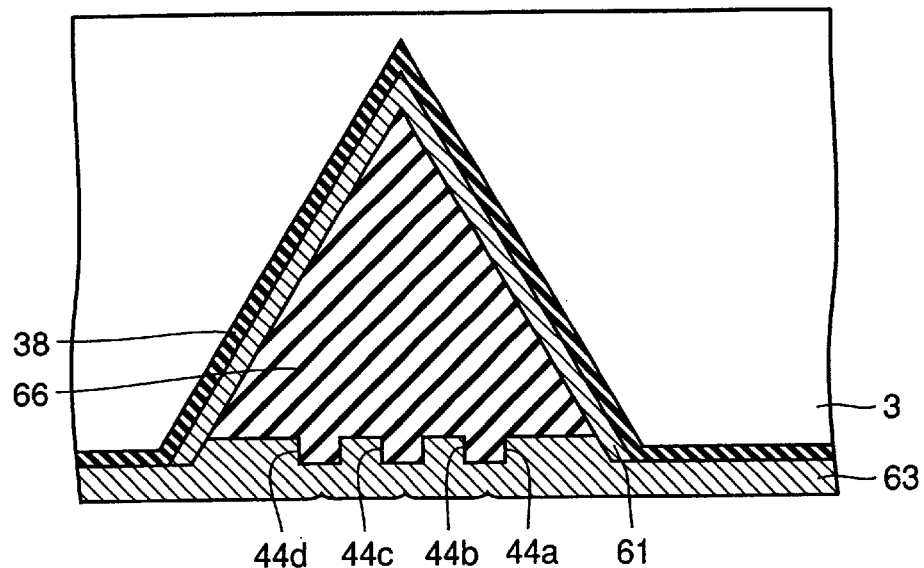

Then, a silicon film 63 having a high nitrogen content is formed to fill up the trenches 44*a* to 44*d*, as shown in FIG. 42.

Figure 43:
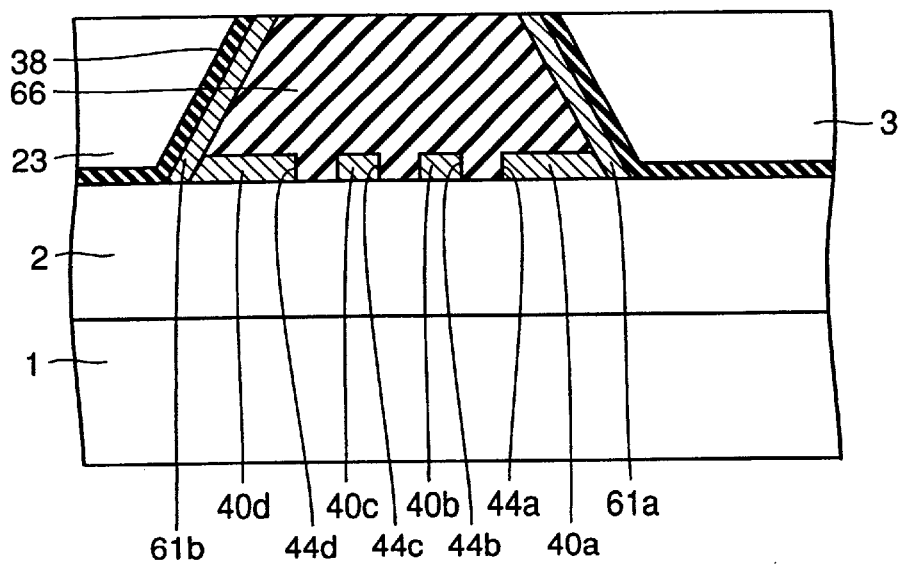

Then, parts of the silicon film 63 positioned on the side wall insulator film 38 are removed and a flattening step is carried out for forming fifth multi-field plate structures 40*a* to 40*d* (see FIG. 43).

Then, steps similar to those for the semiconductor device according to the embodiment 4 shown in FIGS. 30 and 31 are carried out, for obtaining the structure shown in FIG. 43.

Thereafter the field oxide film 11*b* and the like are formed to obtain the semiconductor device shown in FIG. 39.

(Embodiment 7)

Figure 44:
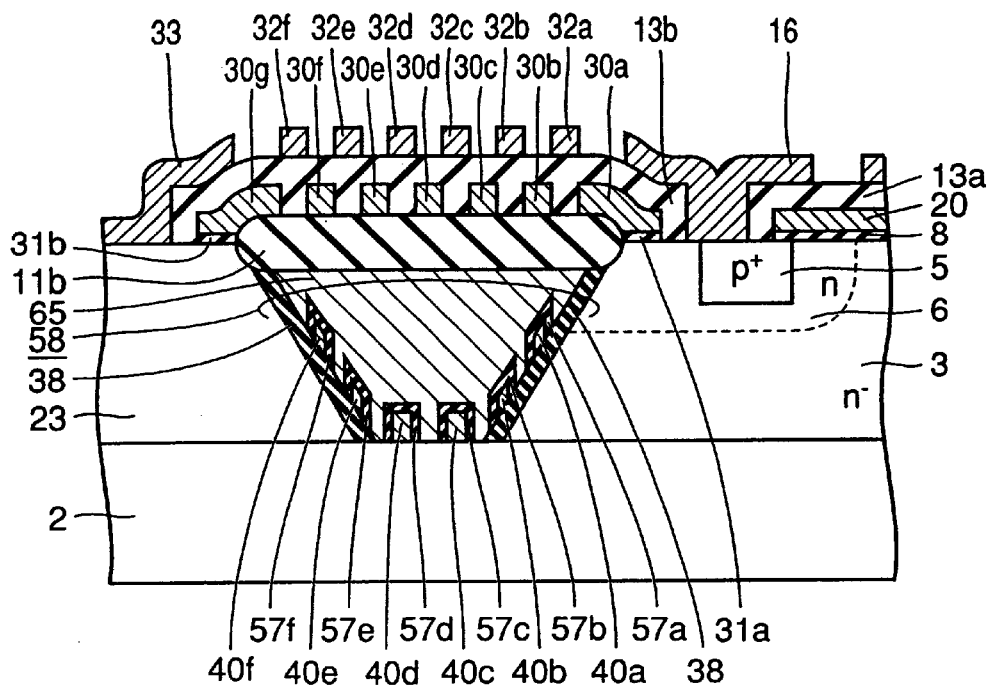
FIG. 44 is a partially enlarged sectional view showing a semiconductor device according to an embodiment 7 of the present invention.

Referring to FIG. 44, this semiconductor device is basically similar in structure to the semiconductor device according to the embodiment 4 of the present invention shown in FIG. 22. In the semiconductor device shown in FIG. 44, however, a forward V-shaped isolation structure 58 is formed under a field oxide film 11b and fifth multi-field plates 40a, 40b, 40e and 40f are formed also on side wall insulator films 38. An n-type emitter diffusion region 6 is not in contact with a buried oxide film 2.

Insulator films 57a to 57f are formed on surfaces of the fifth multi-field plates 40a to 40f. A polysilicon film 65 is formed to fill up the inner part of the forward V-shaped isolation structure 58.

An OFF operation of the semiconductor device shown in FIG. 44 is now described with reference to FIG. 45.

Figure 45:
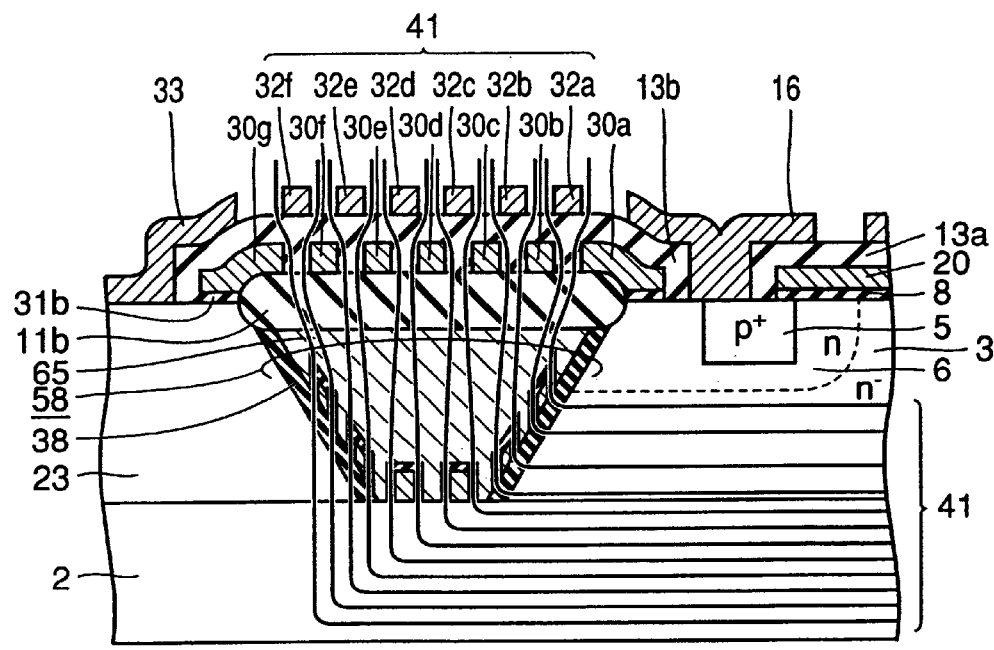
FIG. 45 is a typical sectional view for illustrating an OFF operation of the semiconductor device shown in FIG. 44.

Referring to FIG. 45, the fifth multi-field plates 40a to 40f are formed on the bottom surface and side surfaces of the forward V-shaped isolation structure 58 in this semiconductor device. When the n-type emitter diffusion region 6 is formed in a shallow region on a surface of an SOI layer 3 and a potential 41 is formed to penetrate the SOI layer 3, therefore, the position of an equipotential surface of the potential 41 penetrating the SOI layer 3 can be adjusted for suppressing local electric field concentration. Consequently, it is possible to prevent reduction of breakdown voltage resulting from electric field concentration.

Steps for fabricating the semiconductor device are described with reference to FIGS. 46 to 50.

Figure 46:
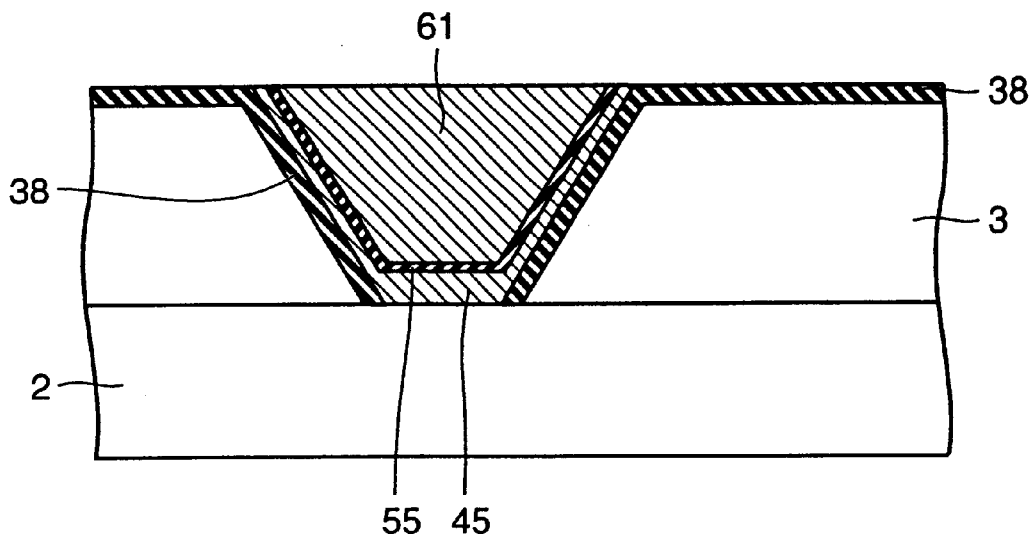
FIGS. 46 to 50 are sectional views for illustrating first to fifth steps for fabricating the semiconductor device shown in FIG. 44.

First, a V-shaped trench is formed on the surface of the $n^-$-type SOI layer 3 having a lower surface bonded with a semiconductor substrate (not shown) provided with a buried oxide film 2 by anisotropic etching employing KOH or the like. The side wall insulator films 38 are formed on the surface of the SOI layer 3 and in the trench. A doped polysilicon film 45 is formed on the side wall insulator films 38. An insulator film 55 is formed on the side wall insulator films 38. A polysilicon film 61 is formed on the insulator film 55. Thereafter parts of the doped polysilicon film 45, the insulator film 55 and the polysilicon film 61 positioned on the surface of the SOI layer 3 are removed by etching. Thus, the structure shown in FIG. 46 is obtained.

Figure 47:
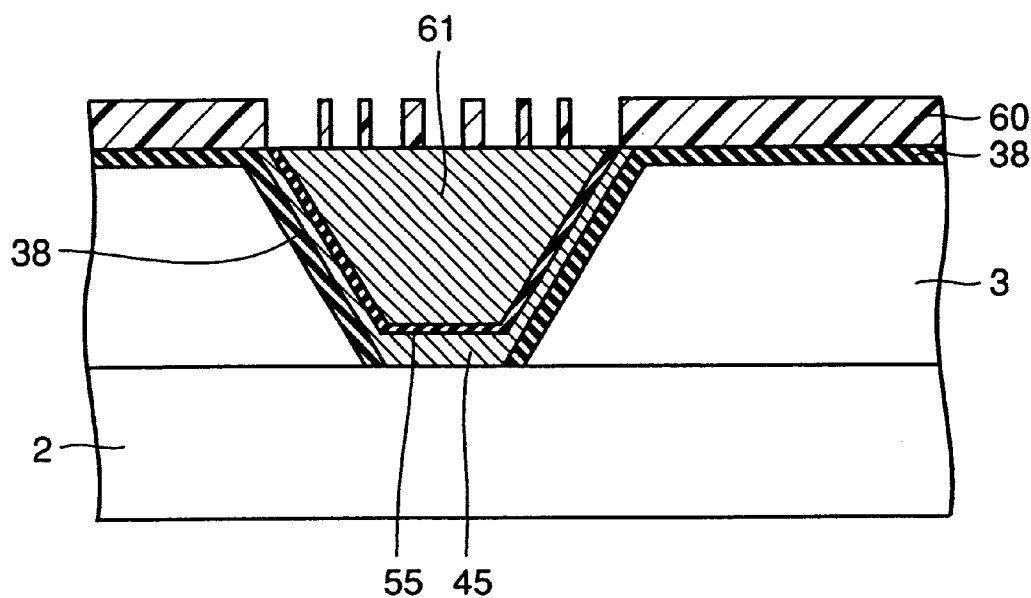
Figure 48:
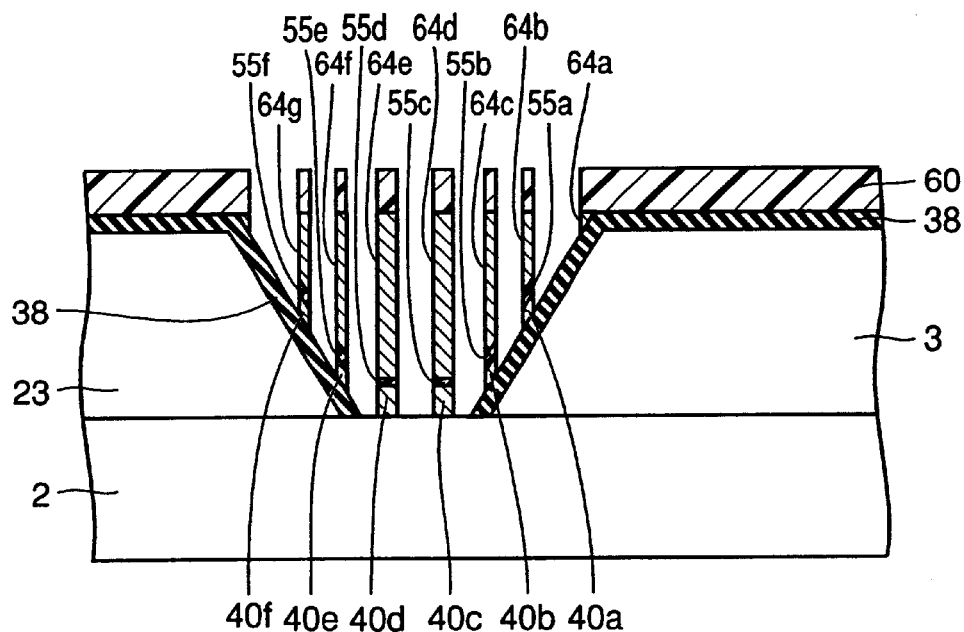

Then, a resist pattern 60 is formed on the side wall insulator films 38 and the polysilicon film 61, as shown in FIG. 47.

Then, the resist pattern 60 is employed as a mask for partially removing the polysilicon film 61, the insulator film 55 and the doped polysilicon film 45 by anisotropic etching, thereby forming trenches 64a to 64g.

Figure 49:
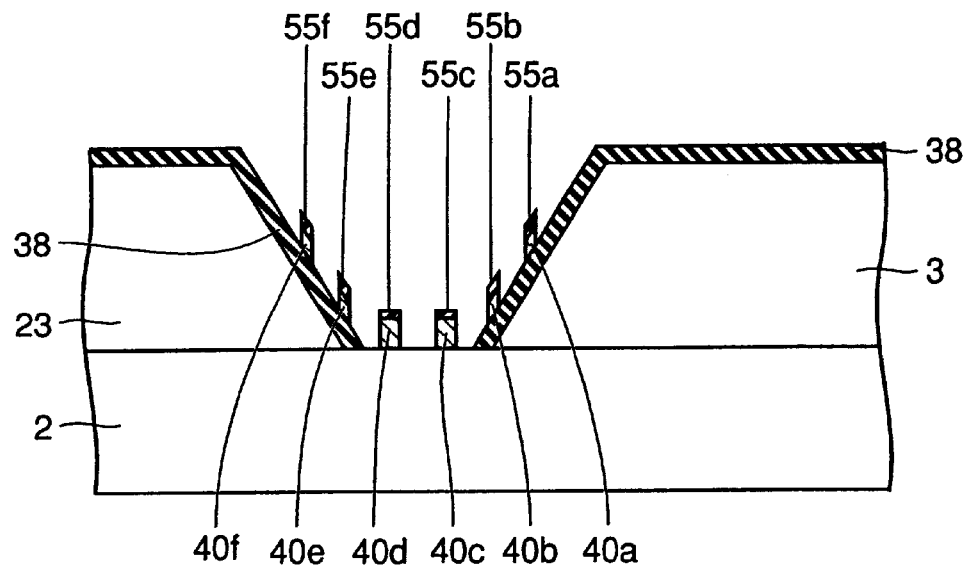
Figure 50:
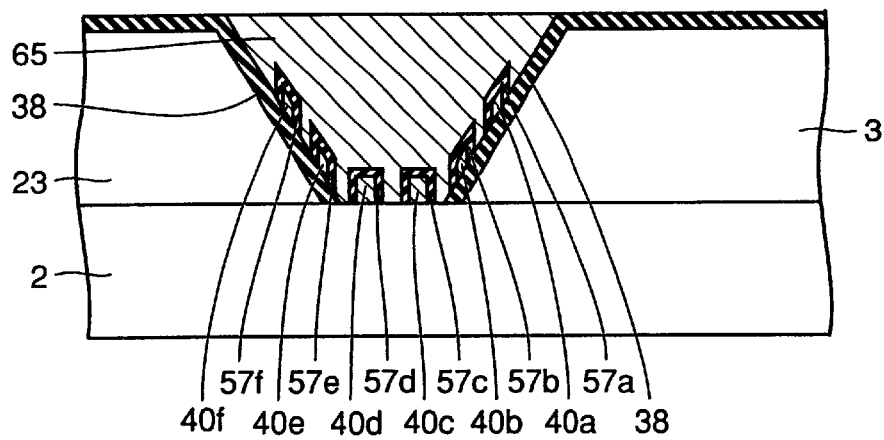
Figure 51:
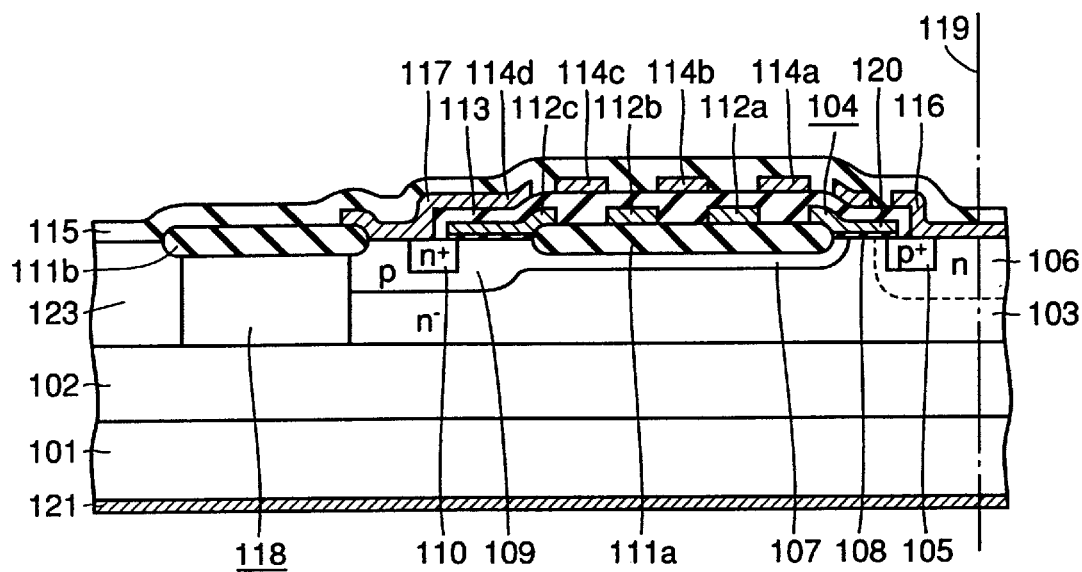
FIG. 51 is a sectional view showing a conventional semiconductor device.
Figure 52:
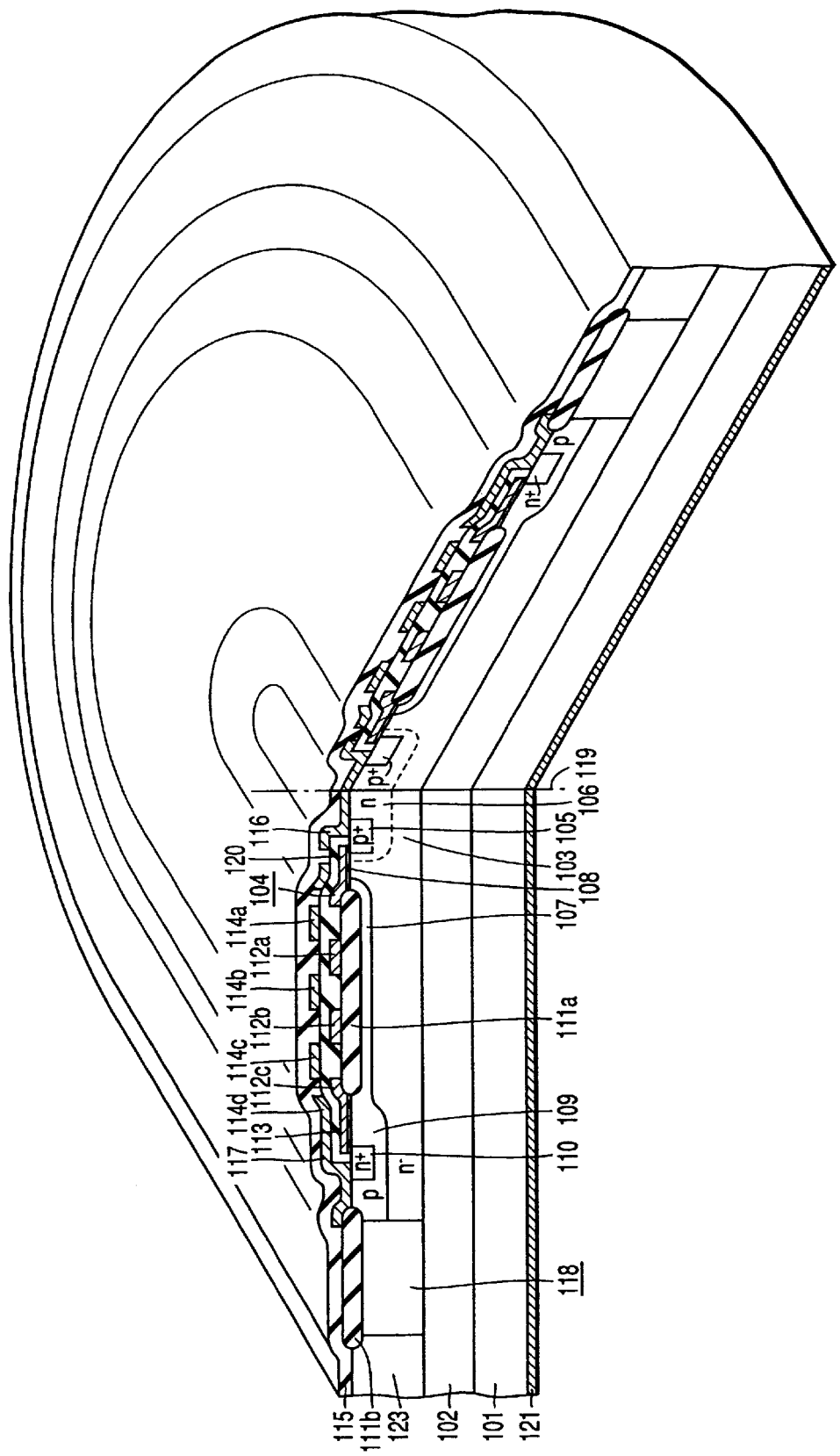
FIG. 52 is a partially fragmented perspective view showing the overall semiconductor device shown in FIG. 51.
Figure 53:
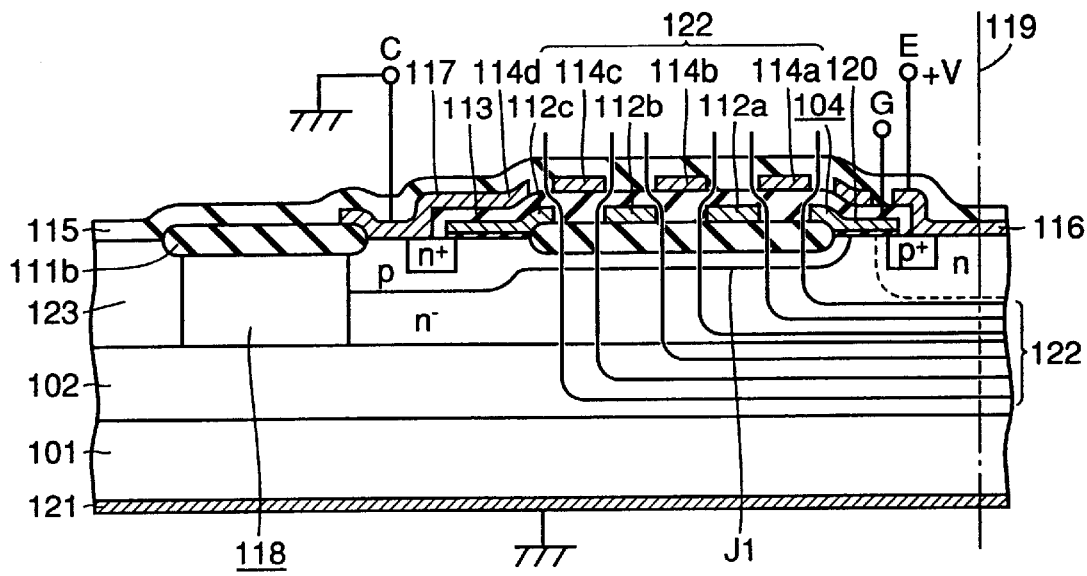
FIG. 53 is a typical sectional view for illustrating an OFF operation of the conventional semiconductor device shown in FIG. 51.
Figure 54:
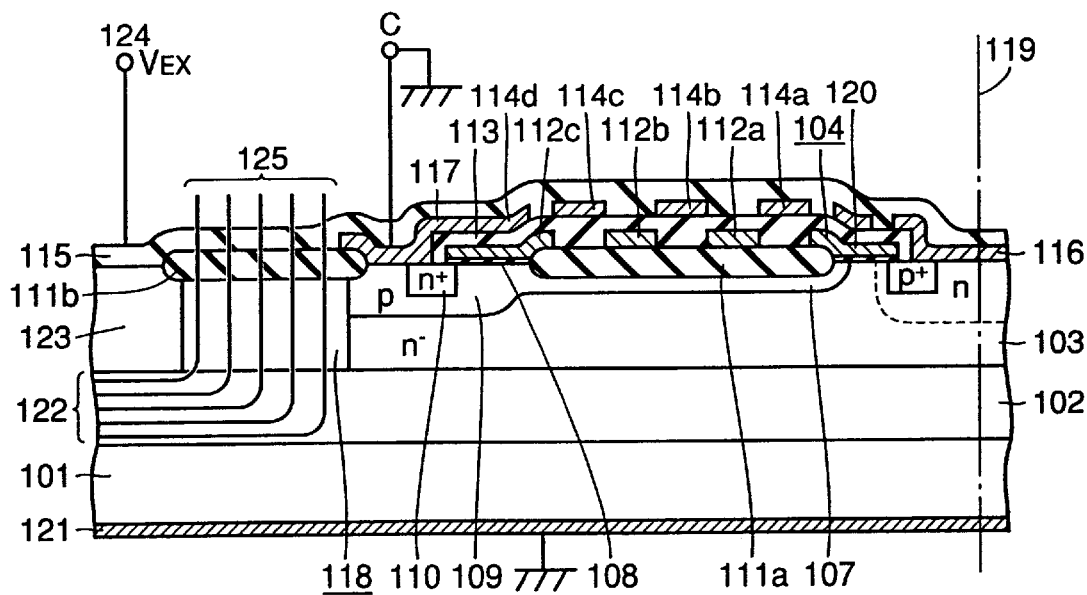
FIG. 54 is a typical sectional view for illustrating the function of a trench isolation structure of the conventional semiconductor device shown in FIG. 51.
Figure 55:
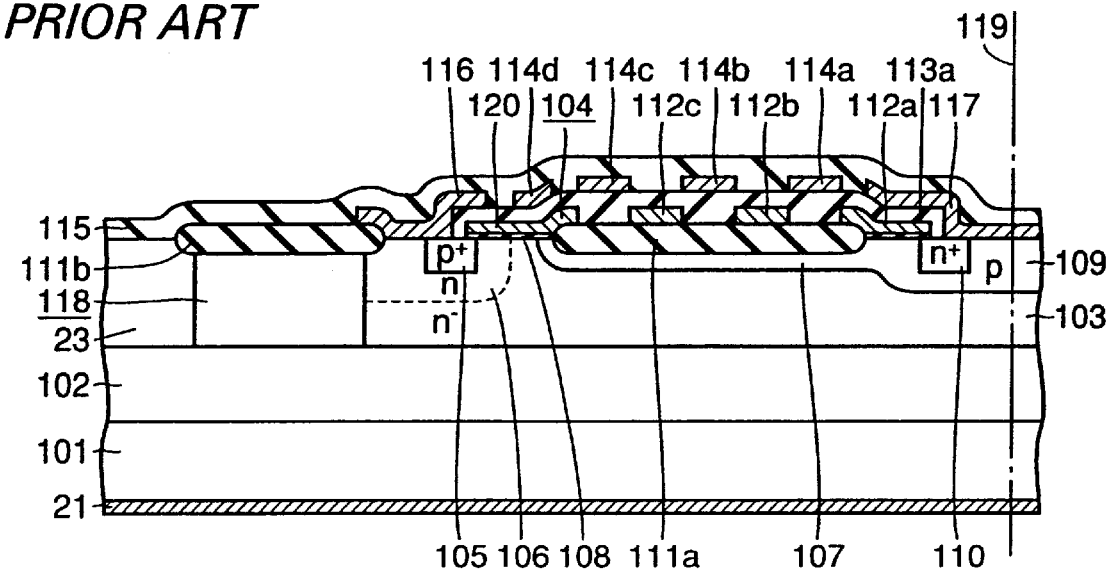
FIG. 55 is a sectional view showing an LIGBT having reversely arranged emitter and collector electrodes.
Figure 56:
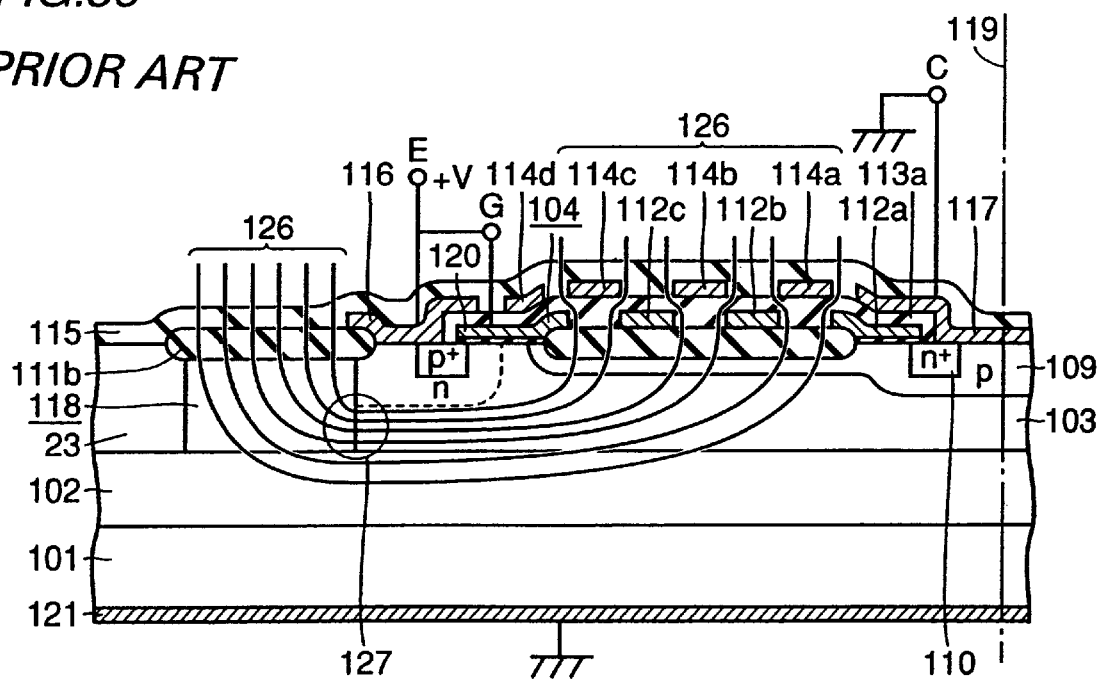
FIG. 56 is a typical sectional view for illustrating an OFF operation of the LIGBT shown in FIG. 55.

Then, the resist pattern 60 is removed as shown in FIG. 49. The polysilicon film 61 is removed by anisotropic etching. Thus, the fifth multi-field plates 40a to 40f can be formed. Insulator films 55a to 55f remain on upper surfaces of the fifth multi-field plates 40a to 40f.

Then, the remaining insulator films 55a to 55f are removed by etching. Insulator films 55a to 55f (see FIG. 50) such as thermal oxide films are formed on the surfaces of the fifth multi-field plates 40a to 40f. A polysilicon film 65 (see FIG. 50) is formed to fill up the trenches 64a to 64g. Thereafter parts of the polysilicon film 65 positioned on the upper surface of the SOI layer 3 are removed by etching, to obtain the structure shown in FIG. 50.

The structure shown in FIG. 44 can be readily obtained by forming the field oxide film 11b (see FIG. 44) and the like.

Referring to FIG. 44, the fifth multi-field plates 40a to 40f may have a resistive potential dividing function in the embodiment 7 of the present invention, similarly to the semiconductor device shown in FIG. 39. In this case, an effect similar to that of the embodiment 6 of the present invention can be further attained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An isolation structure positioned between a first conductive region and a second conductive region formed on a major surface of a semiconductor substrate for isolating said first conductive region and said second conductive region from each other, comprising:

a first conductor formed on a position deeper than said major surface of said semiconductor substrate;

an insulator positioned in a direction opposite to that of the position of said first conductive region as viewed from said first conductor and formed on a position deeper than said major surface of said semiconductor substrate;

a second conductor positioned in a direction opposite to that of the position of said first conductor as viewed from said insulator and formed on a position deeper than said major surface of said semiconductor substrate;

an isolation insulator film formed on said major surface of said semiconductor substrate in a region Positioned on said first and second conductors and said insulator, a first field plate conductor film formed on said isolation insulator film, a second field plate conductor film formed on a position close to said second conductive region from said first field plate conductor film at a space on said isolation insulator film, and a separation insulator film formed between said first field plate conductor film and said second field Plate conductor film.

2. The isolation structure in accordance with claim 1, wherein said first and second conductors and said insulator are formed in a trench formed on said semiconductor substrate.

3. The isolation structure in accordance with claim 1, wherein first and second trenches having side walls are formed on said semiconductor substrate in a region between said first conductive region and said second conductive region, said insulator is formed on said side walls of said first and second trenches, said first conductor is formed on said insulator in said first trench, and said second conductor is formed on said insulator in said second trench.

4. The isolation structure in accordance with claim 1, wherein said first field plate conductor film is electrically connected with said first conductive region through a resistive element, said second field plate conductor film is electrically connected with said second conductive region through a resistive element, and said first field plate conductor film and said second field plate conductor film are electrically connected with each other through a resistive element.

5. The isolation structure in accordance with claim 4, further comprising:
   a first interlayer insulator film formed on said first and second field plate conductor films,
   a third field plate conductor film formed on said first interlayer insulator film,
   a fourth field plate conductor film electrically insulated from said third field plate conductor film and formed at a space on said first interlayer insulator film, and
   an upper insulator film formed between said third field plate conductor film and said fourth field plate conductor film.

6. The isolation structure in accordance with claim 1, further comprising:
   a lower insulator film formed under said semiconductor substrate, wherein
   said first conductive region is formed to be in contact with said lower insulator film.

7. The isolation structure in accordance with claim 2, wherein
   said trench has an upper surface and a lower surface,
   said upper surface has a plane area smaller than that of said lower surface, and
   said first and second conductors are formed on said lower surface.

8. The isolation structure in accordance with claim 7, further comprising:
   an isolation insulator film formed on said major surface of said semiconductor substrate in a region positioned on said trench, wherein
   an end portion of said upper surface of said trench is positioned inward beyond that of said isolation insulator film, and
   an end portion of said lower surface of said trench is positioned outward beyond that of said isolation insulator film.

9. The isolation structure in accordance with claim 7, wherein
   said first conductor is electrically connected with said first conductive region through a resistive element,
   said second conductor is electrically connected with said second conductive region through a resistive element, and
   said first conductor and said second conductor are electrically connected with each other through a resistive element.

10. The isolation structure in accordance with claim 2, wherein
   said trench has an upper surface and a lower surface,
   said upper surface has a plane area larger than that of said lower surface, and
   said first and second conductors are formed on said lower surface.

11. The isolation structure in accordance with claim 10, further comprising:
   third and fourth conductors formed on a side surface of said trench, and
   a side wall insulator film formed between said third and fourth conductors.

12. The isolation structure in accordance with claim 10, wherein
   said first conductor is electrically connected with said first conductive region through a resistive element,
   said second conductor is electrically connected with said second conductive region through a resistive element, and
   said first conductor and said second conductor are electrically connected with each other through a resistive element.

13. An isolation structure positioned between a first conductive region and a second conductive region formed on a major surface of a semiconductor substrate for isolating said first conductive region and said second conductive region from each other, comprising:
   a resistive field plate structure; and
   a capacitive field plate structure being stacked on said resistive field plate structure through an interlayer insulator film,
   said resistive field plate structure including:
      a first field plate conductor film formed between said first conductive region and said second conductive region and connected with said first conductive region through a resistive element; and
      a second field plate conductor film electrically connected with said first field plate conductor film and said second conductive region through resistive elements respectively and formed in the direction of the position of said second conductive region at a space as viewed from said first field plate conductor film,
   said capacitive field plate structure including:
      a third field plate conductor film formed between said first conductive region and said second conductive region;
      a fourth field plate conductor film electrically insulated from said third field plate conductor film and formed at a space; and
      an insulator film positioned between said third field plate conductor film and said fourth field plate conductor film;
   said resistive field plate structure and said capacitive field plate structure are stacked with each other through an interlayer insulator film.

14. A semiconductor device comprising the isolation structure in accordance with claim 1.

15. The semiconductor device in accordance with claim 14, further comprising:
   a first element including said first conductive region, and
   a second element including said second conductive region, wherein
   said first element is a circumferentially formed insulated gate bipolar transistor including an emitter electrode and a collector electrode,
   said isolation structure is formed to enclose said insulated gate bipolar transistor, and
   said emitter electrode is formed on a region closer to the outer periphery of said circumferentially formed insulated gate bipolar transistor than said collector electrode.

16. An isolation structure positioned between a first conductive region and a second conductive region formed on a major surface of a semiconductor substrate for isolating said first conductive region and said second conductive region from each other, comprising:
   a first conductor formed on a position deeper than said major surface of said semiconductor substrate;
   an insulator positioned in a direction opposite to that of the position of said first conductive region as viewed from said first conductor and formed on a position deeper than said major surface of said semiconductor substrate;

a second conductor positioned in a direction opposite to that of the position of said first conductor as viewed from said insulator and formed on a position deeper than said major surface of said semiconductor substrate; and said first and second conductors and said insulator are formed in a trench formed on said semiconductor substrate, said trench having an upper surface and a lower surface, said upper surface has a plane area smaller than that of said lower surface, and said first and second conductors are formed on said lower surface.

17. The isolation structure in accordance with claim 16, wherein first and second inner trenches having side walls are formed on said lower surface of said trench, said insulator is formed on said side walls of said first and second inner trenches, said first conductor is formed on said insulator in said first inner trench, and said second conductor is formed on said insulator in said second inner trench.

18. The isolation structure in accordance with claim 16, further comprising:

an isolation insulator film formed on said major surface of said semiconductor substrate in a region positioned on said first and second conductors and said insulator, a first field plate conductor film formed on said isolation insulator film, a second field plate conductor film formed on a position close to said second conductive region from said first field plate conductor film at a space on said isolation insulator film, and a separation insulator film formed between said first field plate conductor film and said second field plate conductor film.

19. The isolation structure in accordance with claim 18, wherein said first field plate conductor film is electrically connected with said first conductive region through a resistive element, said second field plate conductor film is electrically connected with said second conductive region through a resistive element, and said first field plate conductor film and said second field plate conductor film are electrically connected with each other through a resistive element.

20. The isolation structure in accordance with claim 19, further comprising:

a first interlayer insulator film formed on said first and second field plate conductor films, a third field plate conductor film formed on said first interlayer insulator film, a fourth field plate conductor film electrically insulated from said third field plate conductor film and formed at a space on said first interlayer insulator film, and an upper insulator film formed between said third field plated conductor film and said fourth field plated conductor film.

21. The isolation structure in accordance with claim 16, further comprising a lower insulator film formed under said semiconductor substrate, wherein said first conductive region is formed to be in contact with said lower insulator film.

22. The isolation structure in accordance with claim 16, further comprising:

an isolation insulator film formed on said major surface of said semiconductor substrate in a region positioned on said trench, wherein an end portion of said upper surface of said trench is positioned inward beyond that of said isolation insulator film, and an end portion of said lower surface of said trench is positioned outward beyond that of said isolation insulator film.

23. The isolation structure in accordance with claim 16, wherein said first conductor is electrically connected with said first conductive region through a resistive element, said second conductor is electrically connected with said second conductive region through a resistive element, and said first conductor and said second conductor are electrically connected with each other through a resistive element.

24. A semiconductor device comprising the isolation structure in accordance with claim 16.

25. The semiconductor device in accordance with claim 24, further comprising:

a first element including said first conductive region, and a second element including said second conductive region, wherein said first element is a circumferentially formed insulated gate bipolar transistor including an emitter electrode and a collector electrode, said isolation structure is formed to enclose said insulated gate bipolar transistor; and said emitter electrode is formed on a region closer to the outer periphery of said circumferentially formed insulated gate bipolar transistor than said collector electrode.

26. An isolation structure positioned between a first conductive region and a second conductive region formed on a major surface of a semiconductor substrate for isolating said first conductive region and said second conductive region from each other, comprising:

a first conductor formed on a position deeper than said major surface of said semiconductor substrate;

an insulator positioned in a direction opposite to that of the position of said first conductive region as viewed from said first conductor and formed on a position deeper than said major surface of said semiconductor substrate;

a second conductor positioned in a direction opposite to that of the position of said first conductor as viewed from said insulator and formed on a position deeper than said major surface of said semiconductor substrate; and said first and second conductors and said insulator are formed in a trench formed on said semiconductor substrate, said trench has an upper surface and a lower surface, said upper surface has a plane area larger than that of said lower surface, and said first and second conductors are formed on said lower surface.

27. The isolation structure in accordance with claim 26, wherein said first and second inner trenches having side walls are formed on said lower surface of said trench, said insulator is formed on said side walls of said first and second inner trenches, said first conductor is formed on said insulator in said first inner trench, and said second conductor is formed on said insulator in said second inner trench.

28. The isolation structure in accordance with claim 26, further comprising:

an isolation insulator film formed on said major surface of said semiconductor substrate in a region positioned on said first and second conductors and said insulator, a first field plate conductor film formed on said isolation insulator film, a second field plate conductor film formed on a position close to said second conductive region from said first field plate conductor film at a space on said isolation insulator film, and a separation insulator film formed between said first field plate conductor film and said second field plate conductor film.

29. The isolation structure in accordance with claim 28, wherein said first field plate conductor film is electrically connected with said first conductive region through a resistive element, said second field plate conductor film is electrically connected with said second conductive region through a resistive element, and said first field plate conductor film and said second field plate conductor film are electrically connected with each other through a resistive element.

30. The isolation structure in accordance with claim 29, further comprising:

a first interlayer insulator film formed on said first and second field plate conductor films, a third field plate conductor film formed on said first interlayer insulator film, a fourth field plate conductor film electrically insulated from said third field plate conductor film and formed at a space on said first interlayer insulator film, and an upper insulator film formed between said third field plated conductor film and said fourth field plated conductor film.

31. The isolation structure in accordance with claim 26, further comprising:

a lower insulator film under said semiconductor substrate, wherein said first conductive region is formed to be in contact with said lower insulator film.

32. The isolation structure in accordance with claim 26, further comprising third and fourth conductors formed on a side surface of one of said trench, and a side wall insulator film formed between said third and fourth conductors.

33. The isolation structure in accordance with claim 26, wherein said first conductor is electrically connected with said first conductive region through a resistive element, said second conductor is electrically connected with said second conductive region through a resistive element, and said first conductor and said second conductor are electrically connected with each other through a resistive element.

34. A semiconductor device comprising the isolation structure in accordance with claim 26.

35. The semiconductor device in accordance with claim 14, further comprising:

a first element including said first conductive region, and a second element including said second conductive region, wherein said first element is a circumferentially formed insulated gate bipolar transistor including an emitter electrode and a collector electrode, said isolation structure is formed to enclose said insulated gate bipolar transistor; and said emitter electrode is formed on a region closer to the outer periphery of said circumferentially formed insulated gate bipolar transistor than said collector electrode.

* * * * *